(12) United States Patent
Cheng et al.

(10) Patent No.: US 12,205,946 B2
(45) Date of Patent: Jan. 21, 2025

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Kai-Fang Cheng, Taoyuan (TW); Kuang-Wei Yang, Hsinchu (TW); Cherng-Shiaw Tsai, New Taipei (TW); Hsiaokang Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/229,683

(22) Filed: Aug. 3, 2023

(65) Prior Publication Data

US 2023/0378168 A1 Nov. 23, 2023

Related U.S. Application Data

(62) Division of application No. 17/874,533, filed on Jul. 27, 2022, which is a division of application No. 17/151,345, filed on Jan. 18, 2021, now Pat. No. 11,923,357.

(51) Int. Cl.
*H01L 27/06* (2006.01)
*H01L 23/14* (2006.01)
*H01L 23/538* (2006.01)
*H01L 25/065* (2023.01)

(52) U.S. Cl.
CPC ........ *H01L 27/0688* (2013.01); *H01L 23/147* (2013.01); *H01L 23/5385* (2013.01); *H01L 25/0657* (2013.01)

(58) Field of Classification Search
CPC ............... H01L 23/147; H01L 23/5385; H01L 25/0657; H01L 25/043
See application file for complete search history.

(56) References Cited

U.S. PATENT DOCUMENTS

| 9,105,490 | B2 | 8/2015 | Wang et al. |
| 9,142,505 | B2 | 9/2015 | Yang et al. |
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |

(Continued)

*Primary Examiner* — Trang Q Tran
(74) *Attorney, Agent, or Firm* — NZ CARR LAW OFFICE

(57) ABSTRACT

An interfacial structure, along with methods of forming such, are described. The structure includes a first interfacial layer having a first dielectric layer, a first conductive feature disposed in the first dielectric layer, and a first thermal conductive layer disposed on the first dielectric layer. The structure further includes a second interfacial layer disposed on the first interfacial layer. The second interfacial layer is a mirror image of the first interfacial layer with respect to an interface between the first interfacial layer and the second interfacial layer. The second interfacial layer includes a second thermal conductive layer disposed on the first thermal conductive layer, a second dielectric layer disposed on the second thermal conductive layer, and a second conductive feature disposed in the second dielectric layer.

20 Claims, 18 Drawing Sheets

(56) References Cited

U.S. PATENT DOCUMENTS

| | | |
|---|---|---|
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2018/0130702 A1* | 5/2018 | Patil .................. H01L 23/53209 |
| 2019/0096801 A1 | 3/2019 | Yang et al. |
| 2020/0135677 A1 | 4/2020 | Chang et al. |
| 2020/0194427 A1 | 6/2020 | Dewey et al. |
| 2020/0235063 A1 | 7/2020 | Chen et al. |
| 2021/0098360 A1 | 4/2021 | Chandhok et al. |
| 2021/0104462 A1 | 4/2021 | Lee et al. |
| 2021/0375791 A1 | 12/2021 | Oda et al. |
| 2022/0359499 A1 | 11/2022 | Cheng et al. |

* cited by examiner

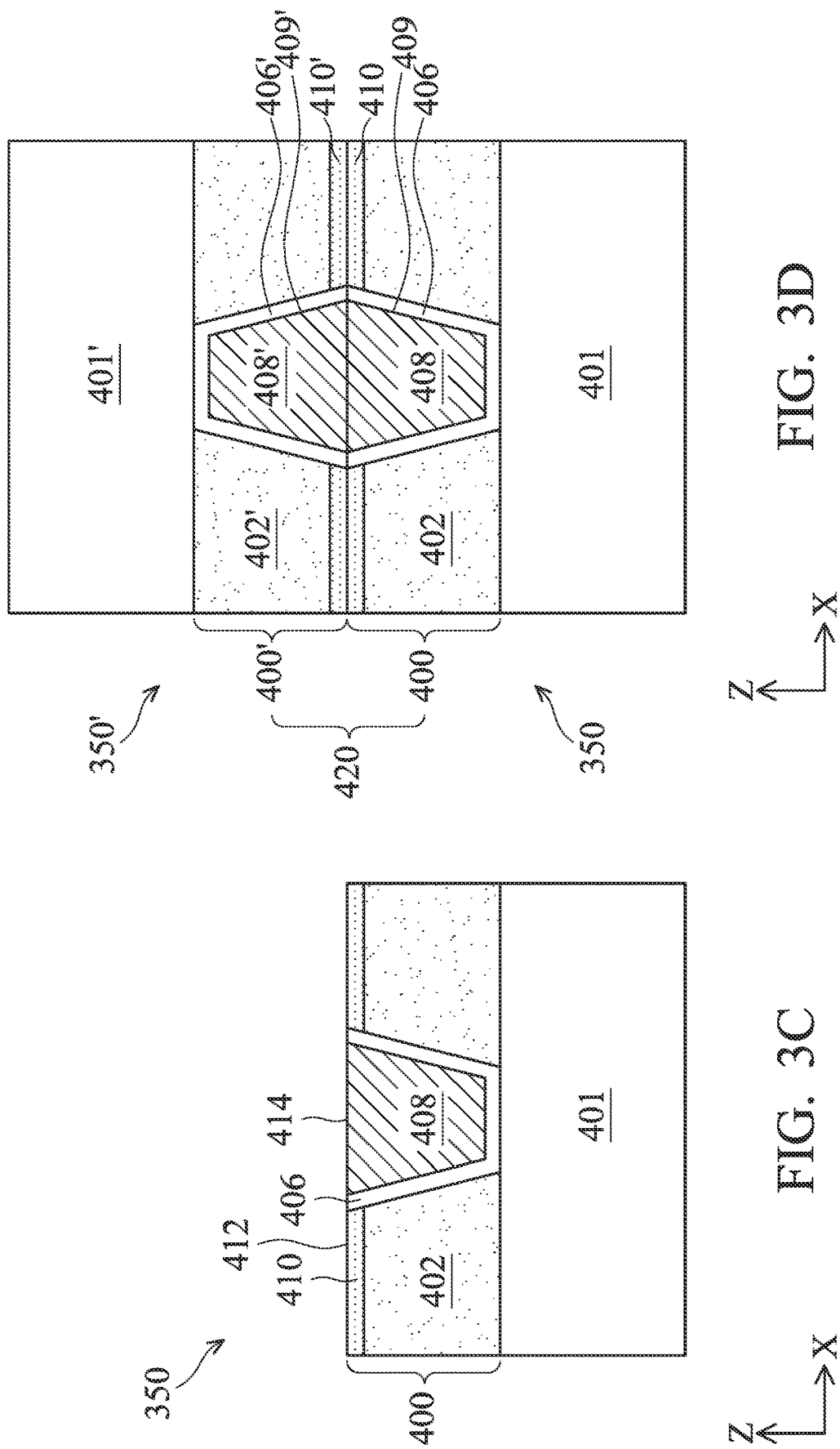

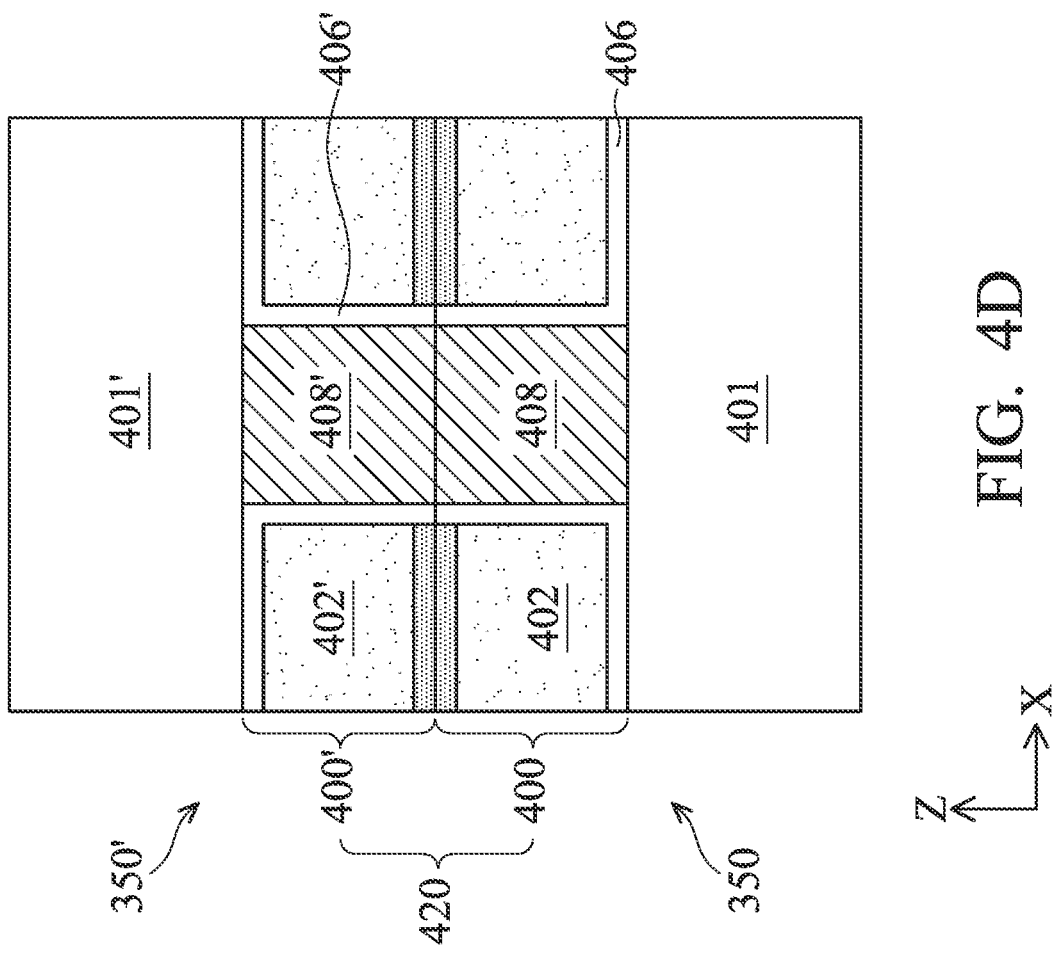
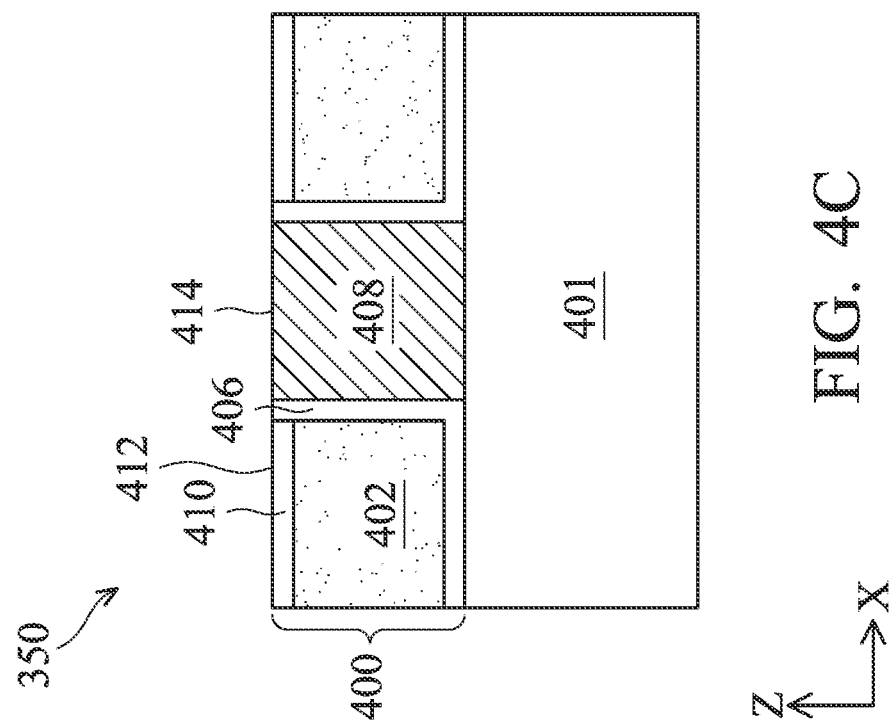
FIG. 4D
FIG. 4C

SEMICONDUCTOR DEVICE STRUCTURE AND METHODS OF FORMING THE SAME

CROSS-REFERENCE TO RELATED APPLICATIONS

This application is a divisional application of U.S. patent application Ser. No. 17/874,533 filed Jul. 27, 2022, which is a divisional application of U.S. patent application Ser. No. 17/151,345 filed Jan. 18, 2021, both of which are incorporated by reference in their entirety.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of a substrate, such as the semiconductor wafer. Although dramatic improvement in lithography has resulted in considerable improvement in 2D integrated circuit (IC) formation, there are physical limits to the density that may be achieved in two dimensions. One of these limits is the minimum size needed to make these components. In addition, when more devices are put into one chip or die, more complex designs are required.

In an attempt to further increase circuit density, three-dimensional integrated circuits (3DICs) have been investigated. In a typical formation process of a 3DIC, two chips or substrates are bonded together. However, performance and reliability of 3DICs may be negatively impacted at high temperature. For example, conventional intermetal dielectric (IMD) material such as $SiO_2$ may not meet the thermal management demand from substrate stacking due to the low intrinsic thermal conductivity. Therefore, there is a need to solve the above problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3E are cross-sectional side views of various stages of manufacturing the semiconductor device structure, in accordance with some embodiments.

FIGS. 4A-4D are cross-sectional side views of various stages of manufacturing the semiconductor device structure, in accordance with alternative embodiments.

DETAILED DESCRIPTION

Figure 1A:
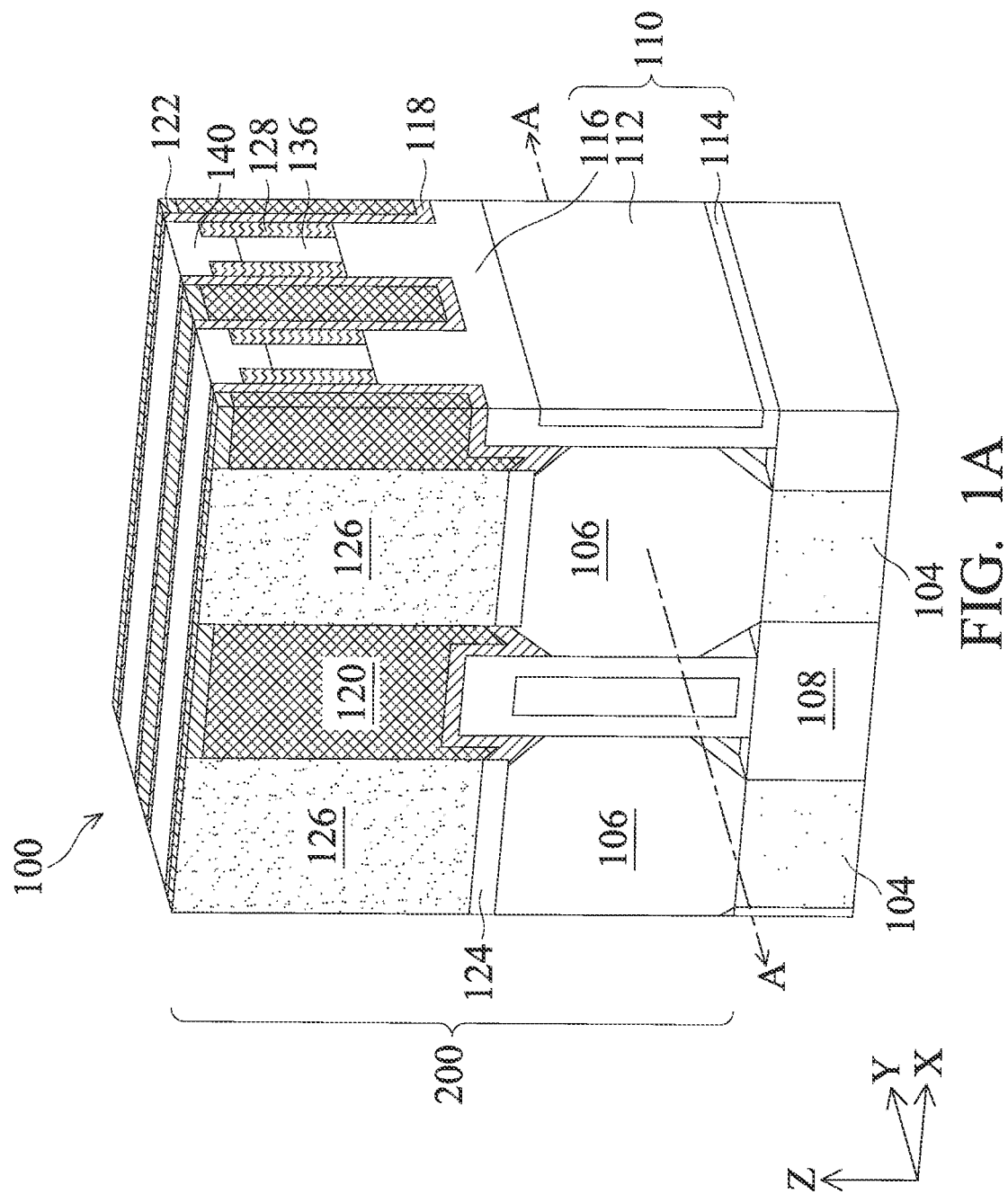
FIG. 1A is a perspective view of one of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
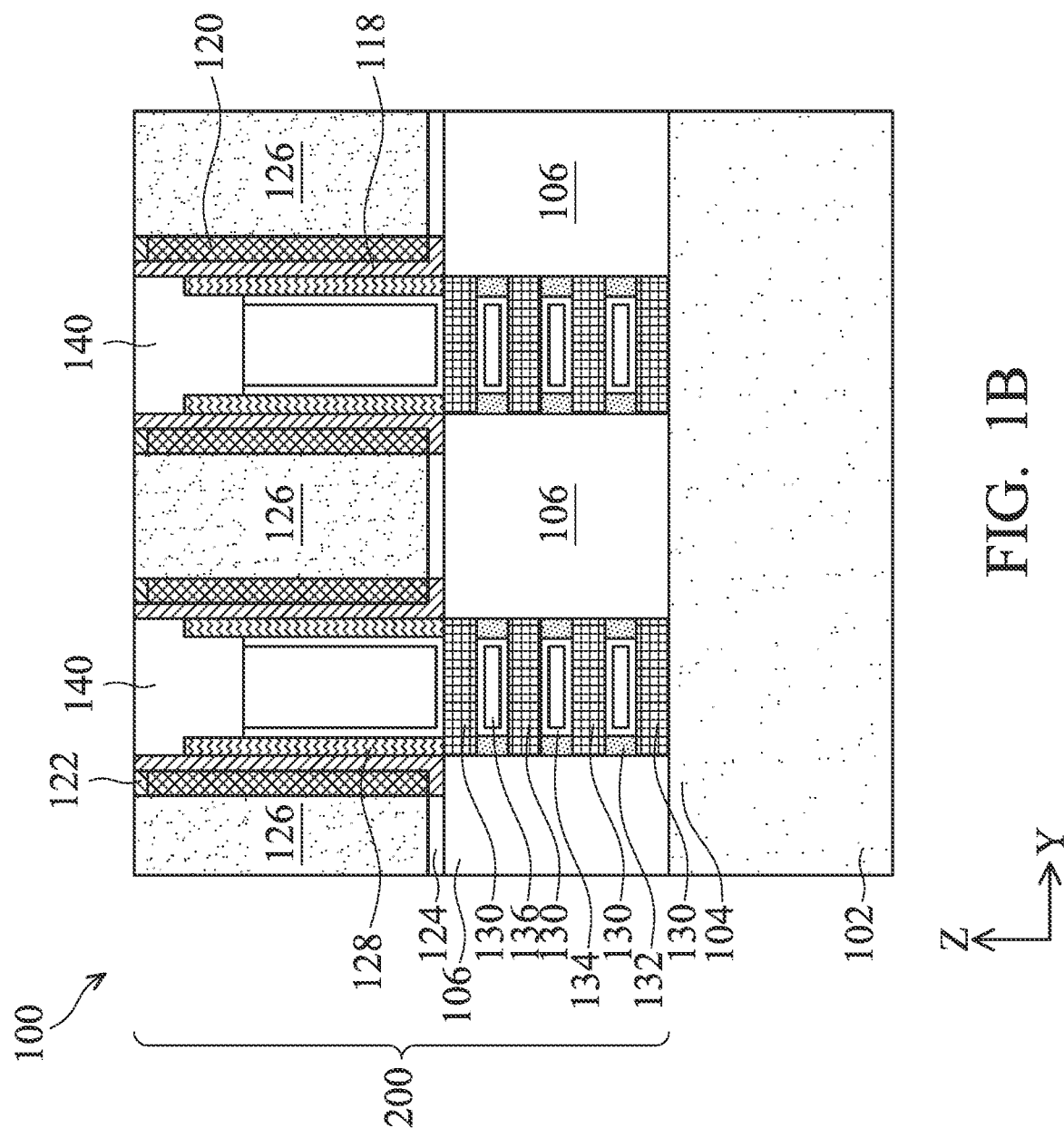
FIG. 1B is a cross-sectional side view of the stage of manufacturing the semiconductor device structure taken along line A-A of FIG. 1A, in accordance with some embodiments.

FIGS. 1A and 1B illustrate a stage of manufacturing a semiconductor device structure 100. As shown in FIGS. 1A and 1B, the semiconductor device structure 100 includes a substrate 102 having substrate portions 104 extending therefrom and source/drain (S/D) epitaxial features 106 disposed over the substrate portions 104. The substrate 102 may be a semiconductor substrate, such as a bulk silicon substrate. In some embodiments, the substrate 102 may be an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; other suitable materials; or combinations thereof. Possible substrates 102 also include a silicon-on-insulator (SOI) substrate. SOI substrates are fabricated using separation by implantation of oxygen (SIMOX), wafer bonding, and/or other suitable methods. The substrate portions 104 may be formed by recessing portions of the substrate 102. Thus, the substrate portions 104 may include the same material as the substrate 102. The substrate 102 and the substrate portions 104 may include various regions that have been suitably doped with impurities (e.g., p-type or n-type impurities). The dopants are, for example boron for a p-type field effect transistor (PFET) and phosphorus for an n-type field effect transistor (NFET). The S/D epitaxial features 106 may include a semiconductor material, such as Si or Ge, a III-V compound semiconductor, a II-VI compound semiconductor, or other suitable semiconductor material. Exemplary S/D epitaxial features 106 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D epitaxial features 106 may include p-type dopants, such as boron; n-type dopants, such as phosphorus or arsenic; and/or other suitable dopants including combinations thereof.

An insulating material 108 is disposed between adjacent substrate portions 104, as shown in FIG. 1A. The insulating material 108 may be made of an oxygen-containing material, such as silicon oxide or fluorine-doped silicate glass (FSG); a nitrogen-containing material, such as silicon nitride, silicon oxynitride (SiON), SiOCN, SiCN; a low-k dielectric material (e.g., a material having a k value lower than 7); or any suitable dielectric material. The insulating material 108 may be the shallow trench isolation (STI). Dielectric features 110 may be formed over the insulating material 108 to separate adjacent S/D epitaxial features 106. The dielectric feature 110 may include a single dielectric material, such as the dielectric material of the insulating material 108, or different dielectric materials. As shown in FIG. 1A, the dielectric feature 110 includes a first dielectric material 112, a liner 114, and a second dielectric material 116. The liner 114 may include a low-k dielectric material, such as SiO$_2$, SiN, SiCN, SiOC, or SiOCN. The first dielectric material 112 may include an oxygen-containing material, such as an oxide, and may be formed by FCVD. The oxygen-containing material may have a K value less than about 7, for example less than about 3. In some embodiments, the first dielectric material 112 includes the same material as the insulating material 108. The second dielectric material 116 may include SiO, SiN, SiC, SiCN, SiON, SiOCN, AlO, AlN, AlON, ZrO, ZrN, ZrAlO, HfO, or other suitable dielectric material. In some embodiments, the second dielectric material 116 includes a high-k dielectric material (e.g., a material having a k value greater than 7).

A contact etch stop layer (CESL) 118 and an interlayer dielectric (ILD) layer 120 are disposed over the dielectric features 110, as shown in FIG. 1A. The CESL 118 may include an oxygen-containing material or a nitrogen-containing material, such as silicon nitride, silicon carbon nitride, silicon oxynitride, carbon nitride, silicon oxide, silicon carbon oxide, the like, or a combination thereof. The materials for the ILD layer 120 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. A cap layer 122 may be disposed on the ILD layer 120, and the cap layer 122 may include a nitrogen-containing material, such as SiCN.

Conductive contacts 126 may be disposed in the ILD layer 120 and over the S/D epitaxial features 106, as shown in FIGS. 1A and 1B. The conductive contacts 126 may include one or more electrically conductive material, such as Ru, Mo, Co, Ni. W, Ti, Ta, Cu, Al, TiN and TaN. Silicide layers 124 may be disposed between the conductive contacts 126 and the S/D epitaxial features 106.

As shown in FIG. 1B, S/D epitaxial features 106 may be connected by one or more semiconductor layers 130, which may be channels of a FET. In some embodiments, the FET is a nanosheet FET including a plurality of semiconductor layers 130, and at least a portion of each semiconductor layer 130 is wrapped around by a gate electrode layer 136. The semiconductor layer 130 may be or include materials such as Si, Ge, SiC, GeAs, GaP, InP, InAs, InSb, GaAsP, AlInAs, AlGaAs, InGaAs, GaInP, GaInAsP, or other suitable material. In some embodiments, each semiconductor layer 130 is made of Si. The gate electrode layer 136 includes one or more layers of electrically conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. In some embodiments, the gate electrode layer 136 includes a metal. A gate dielectric layer 134 may be disposed between the gate electrode layer 136 and the semiconductor layers 130. The gate dielectric layer 134 may include two or more layers, such as an interfacial layer and a high-k dielectric layer. In some embodiments, the interfacial layer is an oxide layer, and the high-k dielectric layer includes hafnium oxide (HfO$_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HMO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide (Ta$_2$O$_5$), yttrium oxide (Y$_2$O$_3$), silicon oxynitride (SiON), hafnium dioxide-alumina (HfO$_2$—Al$_2$O$_3$) alloy, or other suitable high-k materials. The gate dielectric layer 134 and the gate electrode layer 136 may be separated from the S/D epitaxial features 106 by inner spacers 132. The inner spacers 132 may include a dielectric material, such as SiON, SiCN, SiOC, SiOCN, or SiN. The gate dielectric layer 134 and the gate electrode layer 136 may be separated from the CESL 118 by spacers 128. The spacers 128 may include a dielectric material such as silicon oxide, silicon nitride, silicon carbide, silicon oxynitride, SiCN, silicon oxycarbide, SiOCN, and/or combinations thereof. In some embodiments, a self-aligned contact (SAC) layer 140 is formed over the spacers 128, the gate dielectric layer 134, and the gate electrode layer 136, as shown in FIGS. 1A and 1B. The SAC layer 140 may include any suitable material such as SiO, SiN, SiC, SiON, SiOC, SiCN, SiOCN, AlO, AlON, ZrO, ZrN, or combinations thereof.

As shown in FIGS. 1A and 1B, the semiconductor device structure 100 may include the substrate 102 and a device layer 200 disposed over the substrate 102. The device layer 200 may include one or more devices, such as transistors, diodes, imaging sensors, resistors, capacitors, inductors, memory cells, combinations thereof, and/or other suitable devices. In some embodiments, the device layer 200 includes transistors, such as nanosheet FET having a plurality of channels wrapped around by the gate electrode layer, as described above. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The nanosheet channel(s) of the semiconductor device structure 100 may be surrounded by the gate electrode layer. The nanosheet transistors may be referred to as nanowire transistors, gate-all-around (GAA) transistors, multi-bridge channel (MBC) transistors, or any transistors having the gate electrode layer surrounding the channels. In some embodiments, the device layer 200 includes planar FET, FinFET, complementary FET (CFET), forksheet FET, or other suitable devices.

Figure 2:
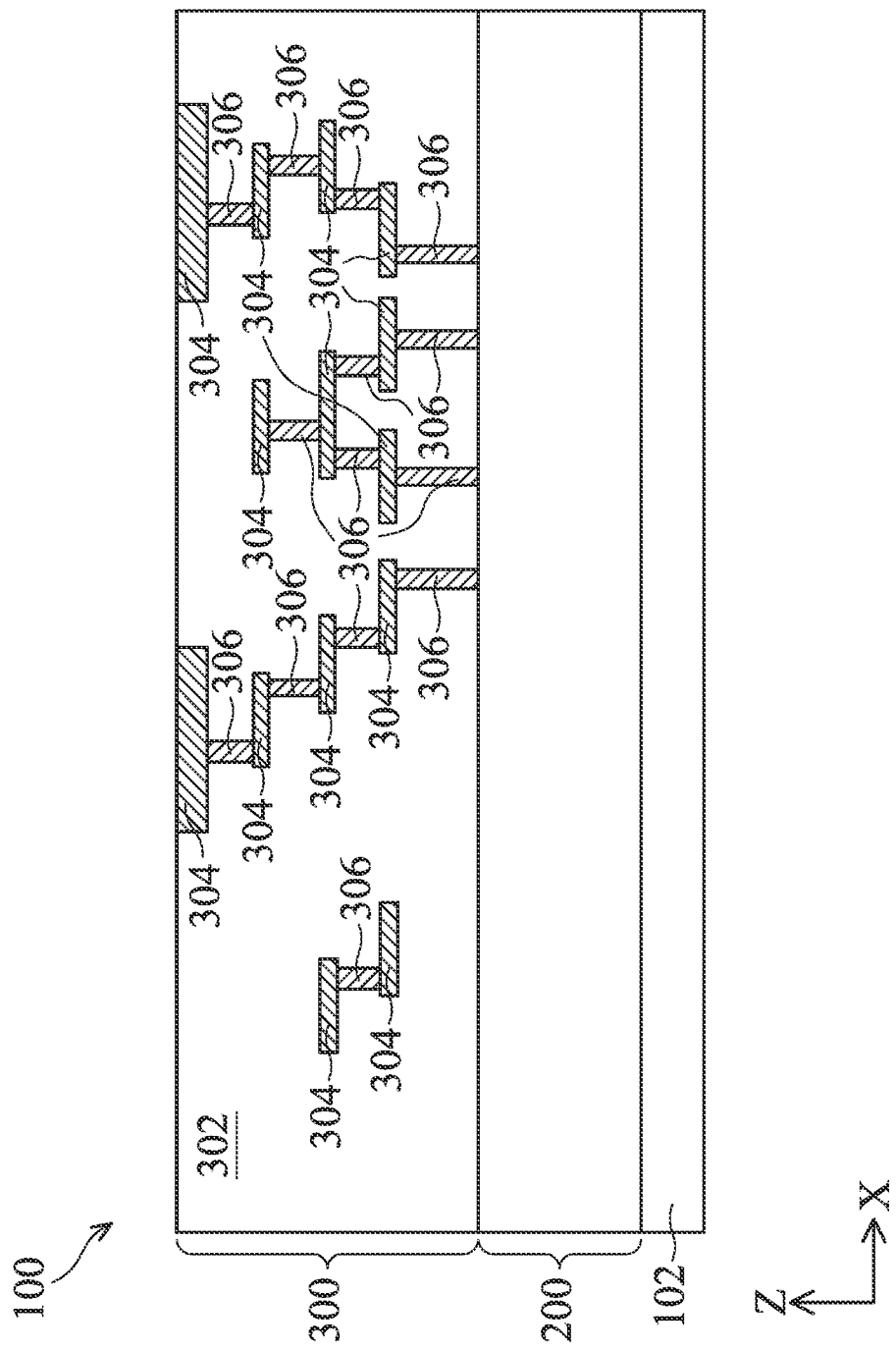
FIG. 2 is a cross-sectional side view of a stage of manufacturing the semiconductor device structure, in accordance with some embodiments.

The semiconductor device structure 100 may further includes an interconnection structure 300 disposed over the device layer 200 and the substrate 102, as shown in FIG. 2. The interconnection structure 300 includes various conductive features, such as a first plurality of conductive features 304 and second plurality of conductive features 306, and an intermetal dielectric (IMD) layer 302 to separate and isolate various conductive features 304, 306. In some embodiments, the first plurality of conductive features 304 are conductive lines and the second plurality of conductive features 306 are conductive vias. The interconnection structure 300 includes multiple levels of the conductive features 304, and the conductive features 304 are arranged in each level to provide electrical paths to various devices in the device layer 200 disposed below. The conductive features 306 provide vertical electrical routing from the device layer 200 to the conductive features 304 and between conductive features 304. For example, the bottom-most conductive features 306 of the interconnection structure 300 may be electrically connected to the conductive contacts 126 (FIG. 1B) and the gate electrode layer 136 (FIG. 1B). The conductive features 304 and conductive features 306 may be made from one or more electrically conductive materials, such as metal, metal alloy, metal nitride, or silicide. For example, the conductive features 304 and the conductive features 306 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof.

The IMD layer 302 includes one or more dielectric materials to provide isolation functions to various conductive features 304, 306. The IMD layer 302 may include multiple dielectric layers embedding multiple levels of conductive features 304, 306. The IMD layer 302 is made from a dielectric material, such as $SiO_x$, $SiO_xC_yH_z$, or $SiO_xC_y$, where x, y and z are integers or non-integers. In some embodiments, the IMD layer 302 includes a dielectric material having a k value ranging from about 1 to about 5. The material of the IMD layer 302 has a low thermal conductivity, such as less than about 1.5 Watts per meter-Kelvin (W/m*K), for example from about 1.2 W/m*K to about 1.5 W/m*K.

Figure 3B:
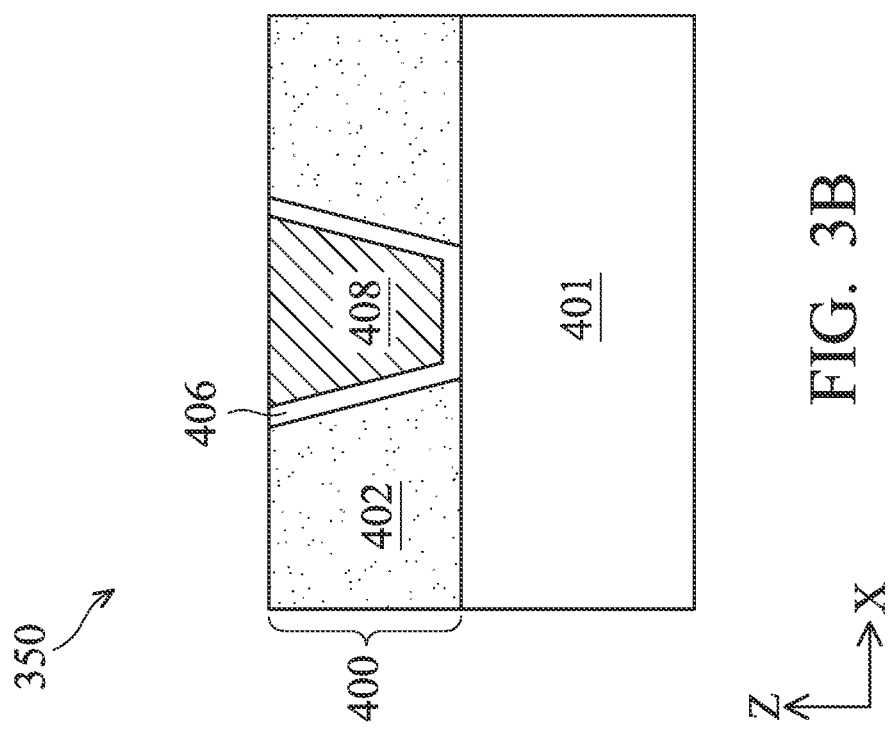
Figure 3A:
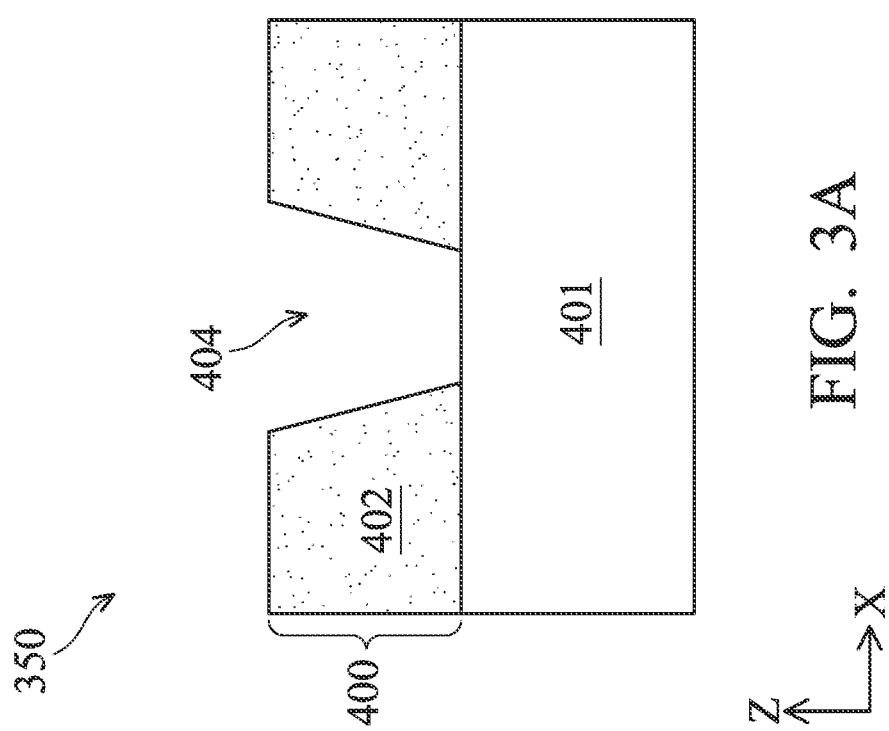

As shown in FIG. 3A, a structure 400 is formed on a structure 401. The structure 401 may be the semiconductor device structure 100 shown in FIG. 2. For example, the structure 400 is formed on the interconnect structure 300 (FIG. 2). In some embodiments, the structure 401 may be the semiconductor device structure 100 shown in FIG. 1B, and the structure 400 is formed on the device layer 200 (FIG. 1B). In some embodiments, the substrate 102 (FIG. 1B and FIG. 2) may be a wafer, such as a 200 mm, 300 mm, 450 mm, or other suitable sized wafer. In such embodiments, the structure 401 includes devices, such as devices formed in the device layer 200 (FIG. 1B), formed on the wafer. Thus, a structure 350 shown in FIG. 3A may be a wafer having materials formed thereon. In some embodiments, the structure 401 may be a die having devices, such as the devices formed in the device layer 200 (FIG. 1B), formed on the substrate 102, which is cut from a wafer. Thus, the structure 350 shown in FIG. 3A may be a die having materials formed thereon.

As shown in FIG. 3A, the structure 400 may be formed by first forming a dielectric layer 402 over the structure 401 and them forming openings 404 (only one is shown) in the dielectric layer 402. One or more etch stop layers (not shown) may be formed between the dielectric layer 402 and the structure 401. The openings 404 may expose portions of the structure 401. In some embodiments, the top-most conductive features 304 (FIG. 2) in the interconnect structure 300 (FIG. 2) are exposed by the openings 404. In some embodiments, the conductive contacts 126 (FIG. 1B) and the gate electrode layer 136 (FIG. 1B) may be exposed by the openings 404. The dielectric layer 402 may include the same material as the IMD layer 302 and may be formed by chemical vapor deposition (CVD), atomic layer deposition (ALD), spin coating, or other suitable process. In some embodiments, an anneal or UV cure process may be performed after depositing the dielectric layer 402. The openings 404 may be formed by any suitable process, such as dry etch, wet etch, or a combination thereof.

As shown in FIG. 3B, a barrier layer 406 and a conductive feature 408 are formed in each opening 404. The barrier layer 406 may include Co, W, Ru, Al, Mo, Ti, TiN, TiSi, CoSi, NiSi, Cu, TaN, Ni, or TiSiNi and may be formed by any suitable process, such as physical vapor deposition (PVD), ALD, or plasma-enhanced CVD (PECVD). In some embodiments, the barrier layer 406 may be a conformal layer formed by a conformal process, such as ALD. The term "conformal" may be used herein for ease of description upon a layer having substantial same thickness over various regions. The conductive feature 408 may include an electrically conductive material, such as a metal. For example, the conductive feature 408 includes Cu, Ni, Co, Ru, Jr, Al, Pt, Pd, Au, Ag, Os, W, Mo, alloys thereof, or other suitable material. The conductive feature 408 may be formed by any suitable process, such as electro-chemical plating (ECP), PVD, CVD, or PECVD. A planarization process is performed to remove the portions of the barrier layer 406 and the conductive feature 408 disposed on the dielectric layer 402, as shown in FIG. 3B. The planarization process may be any suitable process, such as a chemical-mechanical polishing (CMP) process.

As shown in FIG. 3C, a thermal conductive layer 410 is formed on the dielectric layer 402. In some embodiments, the dielectric layer 402 may be recessed, and the thermal conductive layer 410 may include a surface 412 that is substantially co-planar with a surface 414 of the conductive feature 408. For example, the dielectric layer 402 is recessed by a selective etch process that removes a portion of the dielectric layer 402 but not the barrier layer 406 or the conductive feature 408. The thermal conductive layer 410 is then formed on the recessed dielectric layer 402 by a suitable process, such as ALD, CVD, or spin coating. The thermal conductive layer 410 may be initially formed on the dielectric layer 402, the barrier layer 406, and the conductive feature 408, and a planarization process may be performed to expose the barrier layer 406 and the conductive feature 408. The planarization process may be any suitable process, such as CMP process, that removes portions of the thermal conductive layer 410 formed on the barrier layer 406 and the conductive feature 408. The thermal conductive layer 410 may have a thickness ranging from about 1 nm to about 5000 nm.

The thermal conductive layer 410 may include a material having thermal conductivity higher than that of the dielectric layer 402. In some embodiments, the thermal conductive layer 410 includes a material having thermal conductivity greater than about 1.5 W/m*K, such as from about 2 W/m*K to about 2500 W/m*K. The thermal conductive layer 410 may include a material such as SiC, SiN, SiCN, AlN, AlO$_x$, boron nitride (BN), diamond, diamond-like carbon (DLC), graphene oxide, graphite, or other suitable material. In some embodiments, the thermal conductive layer 410 includes BN, DLC, graphene oxide, or graphite. The material of the thermal conductive layer 410 may be monocrystalline or polycrystalline.

The structure 350 shown in FIG. 3C may be a wafer having materials formed thereon or an IC die, as described above. In some embodiments, in order to form a 3DIC, the structure 350 shown in FIG. 3C may be bonded to another structure. As shown in FIG. 3D, the structure 350 is bonded to a structure 350'. The structure 350' may be a wafer having devices formed thereon or an IC die, depending on the nature of the structure 350. In some embodiments, a wafer-stacking process includes bonding a first wafer having materials formed thereon to a second wafer having materials formed thereon, and the first and second wafers may be the structures 350, 350', respectively. In some embodiments, the two structures 350, 350' may be bonded by hybrid bonding at a temperature ranging from about 20 degrees Celsius to about 400 degrees Celsius. As a result of bonding the two structures 350, 350', a plurality of 3DICs are formed, each 3DIC includes first devices in the structure 350 electrically coupled to second devices in the structure 350'. Subsequently, a wafer dicing process may be performed on the bonded structures 350, 350' to form a plurality of separated 3DICs.

In some embodiments, a die-stacking process includes bonding a first die to a second die, and the first and second dies may be the structures 350, 350', respectively. The bonding of the dies may be the same as the bonding of wafers, as described above. As a result, a 3DIC die is formed.

As shown in FIG. 3D, the structure 350' is bonded to the structure 350. The structure 350' may include a structure 400' disposed over a structure 401'. The structure 400' may include the same materials as the structure 400. For example, the structure 400' may include a dielectric layer 402', barrier layers 406', conductive features 408', and a thermal conductive layer 410'. The dielectric layer 402' may include the same material as the dielectric layer 402, the barrier layers 406' may include the same material as the barrier layers 406, the conductive features 408' may include the same material as the conductive features 408, and the thermal conductive layer 410' may include the same material as the thermal conductive layer 410. The arrangement of the barrier layers 406', the conductive features 408', and the thermal conductive layer 410' may be the same as the arrangement of the barrier layers 406, the conductive features 408, and the thermal conductive layer 410. In some embodiments, the structure 400' is identical to the structure 400.

In some embodiments, the structure 401' is identical to the structure 401. In some embodiments, the structure 401' is different from the structure 401. For example, the structure 401' may include the substrate 102 (FIG. 1B), the device layer 200 (FIG. 1B), and optionally the interconnect structure 300 (FIG. 2). The device layer 200 in the structure 401' may be different from the device layer 200 in the structure 401. The interconnect structure 300 in the structure 401' may be different from the interconnect structure 300 in the structure 401. The differences in the device layers 200 in the structure 401' compared to in the structure 401 may be the type of devices, the number of devices, or the arrangement of devices.

As shown in FIG. 3D, the structure 350' may be flipped over and bonded to the structure 350, and the structure 400 is bonded to the structure 400'. For example, the thermal conductive layer 410 is bonded to the thermal conductive layer 410', and the conductive feature 408 is bonded to the conductive feature 408'. The bonding may be a result of exposing the structures 350', 350 to a temperature ranging from about 20 degrees Celsius to about 400 degrees Celsius. The thermal management capability for wafer stacking or die stacking may be improved due to increased thermal conductivity of the thermal conductive layers 410, 410' compared to the thermal conductivity of the dielectric layers 402, 402'. Furthermore, bondable thermal conductive layers 410, 410' may improve thermal dissipation and more efficient bonding process. Thus, if the thickness of the thermal conductive layer 410 is less than about 1 nm, the thermal conductive layer 410 may not be sufficient to improve thermal management capability for wafer stacking or die stacking and/or to improve thermal dissipation. On the other hand, if the thickness of the thermal conductive layer 410 is greater than about 5000 nm, manufacturing cost is increased without significant advantage.

The bonded structures 400, 400' form an interfacial structure 420, as shown in FIG. 3D. In some embodiments, the interfacial structure 420 includes the structures 400, 400' that are substantially symmetrical with respect to an interface between the structures 400, 400'. For example, the conductive feature 408 may include a tapered sidewall 409, the corresponding conductive feature 408' disposed over the conductive feature 408 may include a corresponding tapered sidewall 409' disposed over the tapered sidewall 409, and the tapered sidewall 409 and the tapered sidewall 409' may taper in opposite directions. Because the structures 400, 400' are substantially symmetrical, the conductive features 408 are aligned with corresponding conductive features 408'. In some embodiments, the structure 400' is a mirror image of the structure 400 with respect to an interface between the structure 400 and the structure 400'.

Figure 3E:
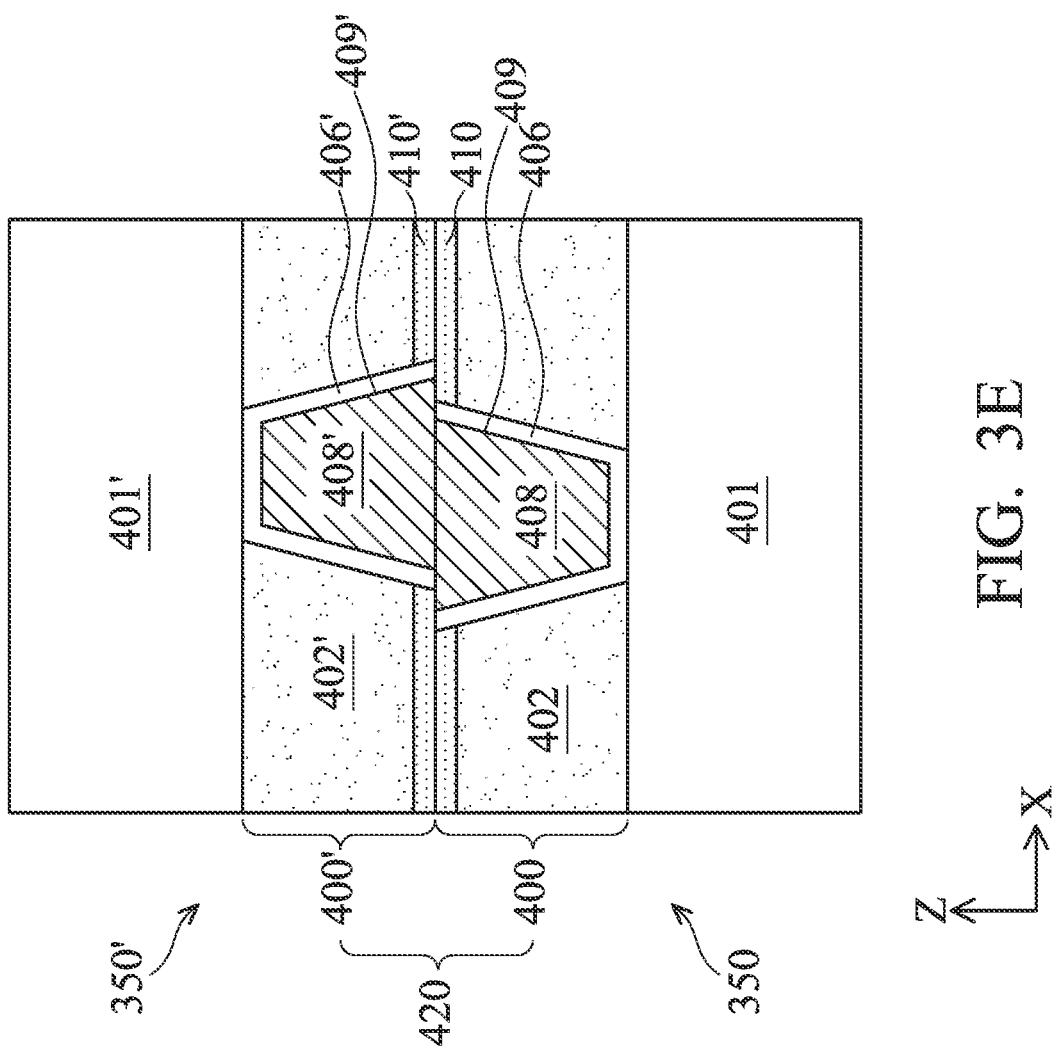

As shown in FIG. 3E, in some embodiments, the structures 400, 400' are substantially asymmetrical, and the conductive features 408 may be slightly misaligned but still in contact with corresponding conductive features 408'. For example, the barrier layer 406 may be in contact with the conductive feature 408' and the thermal conductive layer 410', and the barrier layer 406' may be in contact with the conductive feature 408 and the thermal conductive layer 410. In some embodiments, the thermal conductive layer 410' may be disposed over the barrier layer 406 and a portion of the conductive feature 408. The conductive feature 408' may be disposed over the barrier layer 406 and a portion of the thermal conductive layer 410.

Figure 4B:
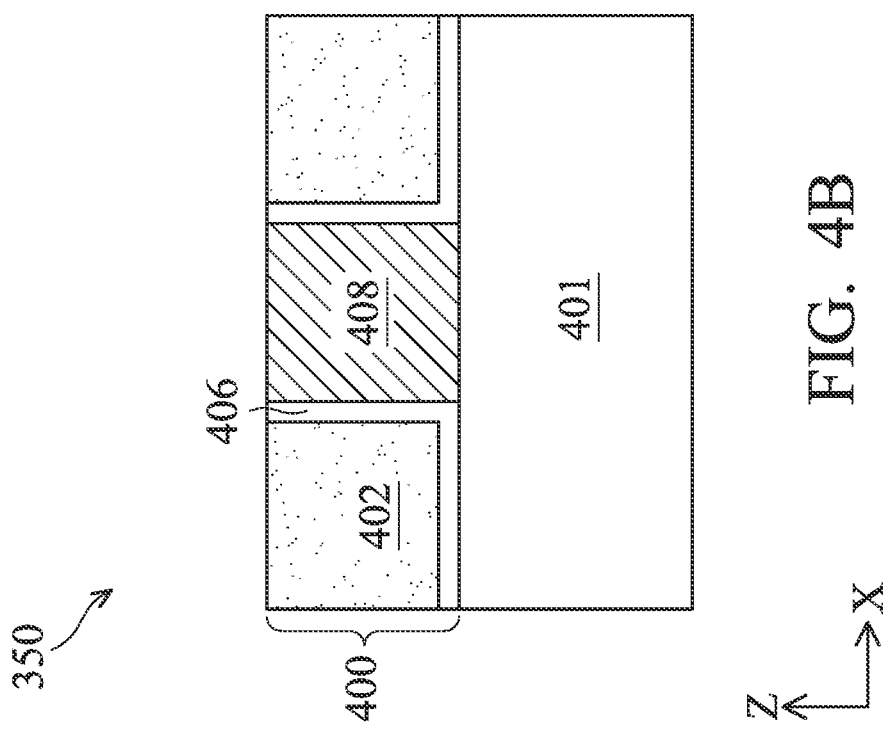
Figure 4A:
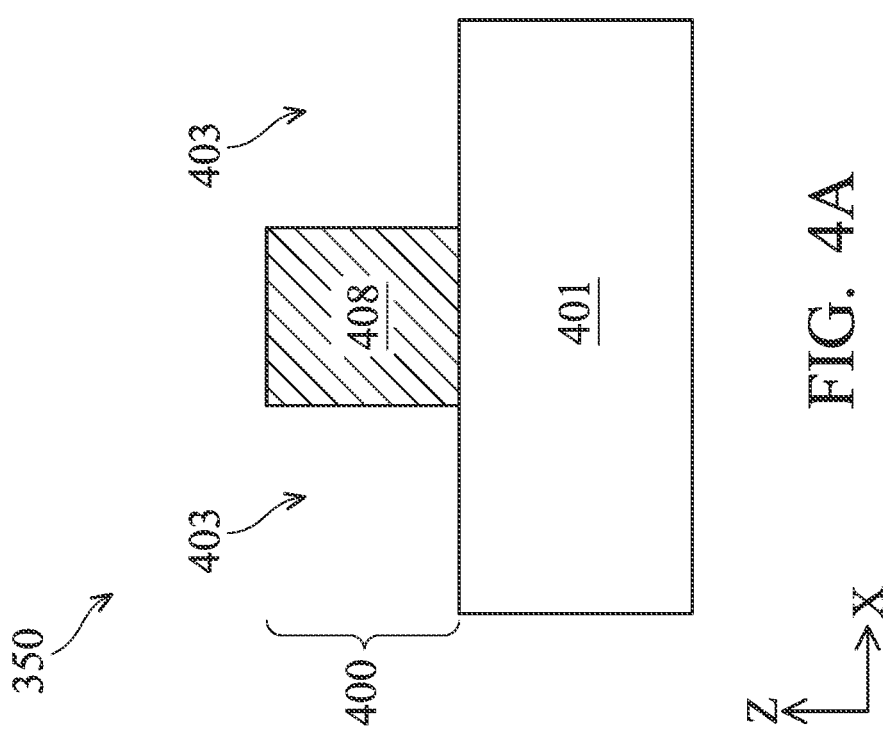

FIGS. 4A-4D illustrate an alternate method of forming the structure 400 and the structure 400'. As shown in FIG. 4A, the conductive features 408 are formed over the structure 401. The conductive features 408 may be formed by first forming a conductive layer over the structure 401 followed by patterning the conductive layer to form the conductive features 408. Openings 403 are formed as a result of the patterning the conductive layer.

As shown in FIG. 4B, the barrier layers 406 and the dielectric layers 402 are formed in the openings 403. In some embodiments, the dielectric layers 402 may be initially formed in the openings 403 and on the conductive features 408, and a subsequent planarization process may be performed to expose the conductive features 408. As a result, surfaces of the dielectric layers 402 may be co-planar with surfaces of the conductive features 408, as shown in FIG. 4B. As shown in FIG. 4C, the dielectric layers 402 may be recessed, and the thermal conductive layer 410 may be formed on the dielectric layers 402. The thermal conductive layer 410 may include the surface 412 that is substantially co-planar with the surface 414 of the conductive feature 408. In some embodiments, the dielectric layers 402 are formed to the level shown in FIG. 4C, and the planarization and recess processes may be omitted. As shown in FIG. 4C, the structure 400 is formed over the structure 401.

As shown in FIG. 4D, the structure 350' may include the structure 400' which may be identical to the structure 400 and the structure 401' which may or may not be identical to the structure 401, as described in FIG. 3D. The structure 350' may be flipped over and bonded to the structure 350, and the structure 400 is bonded to the structure 400'. For example, the thermal conductive layer 410 is bonded to the thermal conductive layer 410', and the conductive feature 408 is bonded to the conductive feature 408'. The bonding may be a result of exposing the structures 350', 350 to a temperature ranging from about 20 degrees Celsius to about 400 degrees Celsius. The thermal management capability for wafer stacking or die stacking may be improved due to increased thermal conductivity of the thermal conductive layers 410, 410' compared to the thermal conductivity of the dielectric layers 402, 402'. Furthermore, bondable thermal conductive layers 410, 410' may improve thermal dissipation and more efficient bonding process.

The bonded structures 400, 400' form the interfacial structure 420, as shown in FIG. 4D. In some embodiments, the interfacial structure 420 includes the structures 400, 400' that are substantially symmetrical with respect to an interface between the structures 400, 400'. Because the structures 400, 400' are substantially symmetrical, the conductive features 408 are aligned with corresponding conductive features 408'. In some embodiments, the structures 400, 400' are substantially asymmetrical, and the conductive features 408 may be slightly misaligned but still in contact with corresponding conductive features 408'.

Figures 5A, 5B:
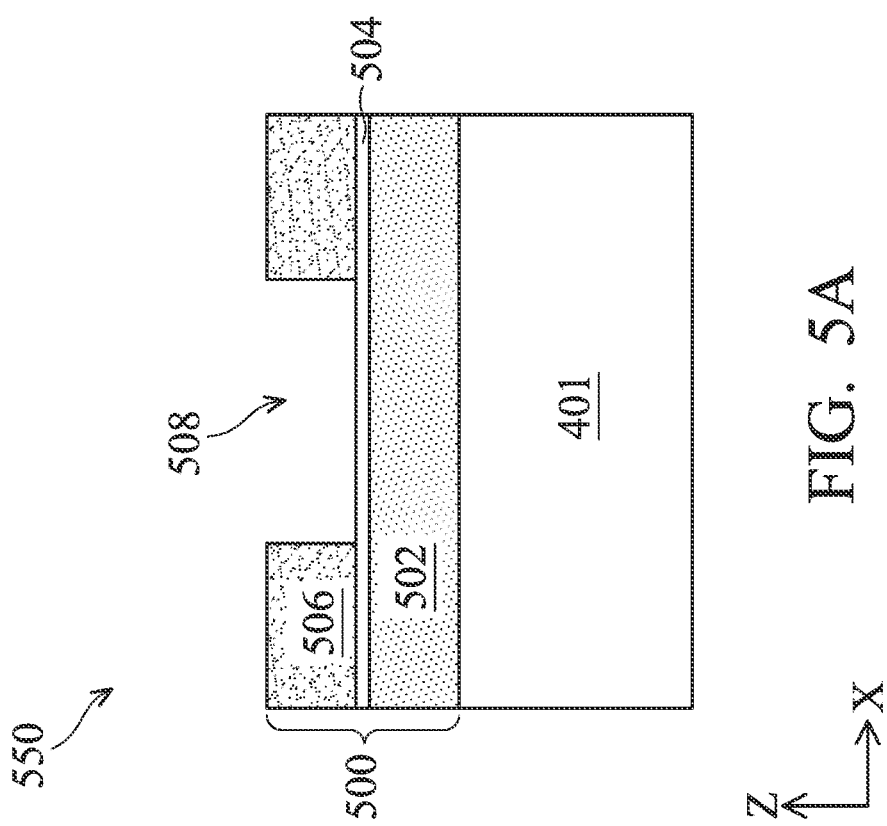
FIGS. 5A-5E are cross-sectional side views of various stages of manufacturing the semiconductor device structure, in accordance with alternative embodiments.

FIGS. 5A-5E illustrate a method of forming a structure 500 and a structure 500'. For example, the structures 500, 500' may be formed by a dual-damascene process. As shown in FIG. 5A, a structure 550 includes the structure 500, which may be formed by first forming a first dielectric layer 502 and a second dielectric layer 506 over the first dielectric layer 502. The first dielectric layer 502 and the second dielectric layer 506 may be separated by an etch stop layer 504. One or more etch stop layers (not shown) may be formed between the first dielectric layer 502 and the structure 401. The first and second dielectric layers 502, 506 may include the same material as the dielectric layer 402 and may be formed by the same method as the dielectric layer 402. The etch stop layer 504 may include an oxygen-containing material or a nitrogen-containing material, such as silicon nitride, silicon carbon nitride, silicon oxynitride, carbon nitride, silicon oxide, silicon carbon oxide, the like, or a combination thereof. The etch stop layer 504 may be formed by CVD, PECVD, ALD, or any suitable deposition technique. In some embodiments, the etch stop layer 504 is a conformal layer formed by the ALD process. The etch stop layer 504 and the first and second dielectric layers 502, 506 may have different etch selectivity. Openings 508 may be formed in the second dielectric layer 506 to expose portions of the etch stop layer 504. In some embodiments, openings 508 are trenches.

As shown in FIG. 5B, a portion of the exposed portions of the etch stop layer 504 and a portion of the first dielectric layer 502 disposed therebelow are removed to expose portions of the structure 401. Openings 510 are formed as a result of the removal of the portions of the etch stop layer 504 and the first dielectric layer 502. In some embodiments, the top-most conductive features 304 (FIG. 2) in the interconnect structure 300 (FIG. 2) are exposed by the openings 510. In some embodiments, the conductive contacts 126 (FIG. 1B) and the gate electrode layer 136 (FIG. 1B) may be exposed by the openings 510. The openings 510 may have smaller dimensions than the openings 508. In some embodiments, the openings 510 are via openings.

Figures 5C, 5D:
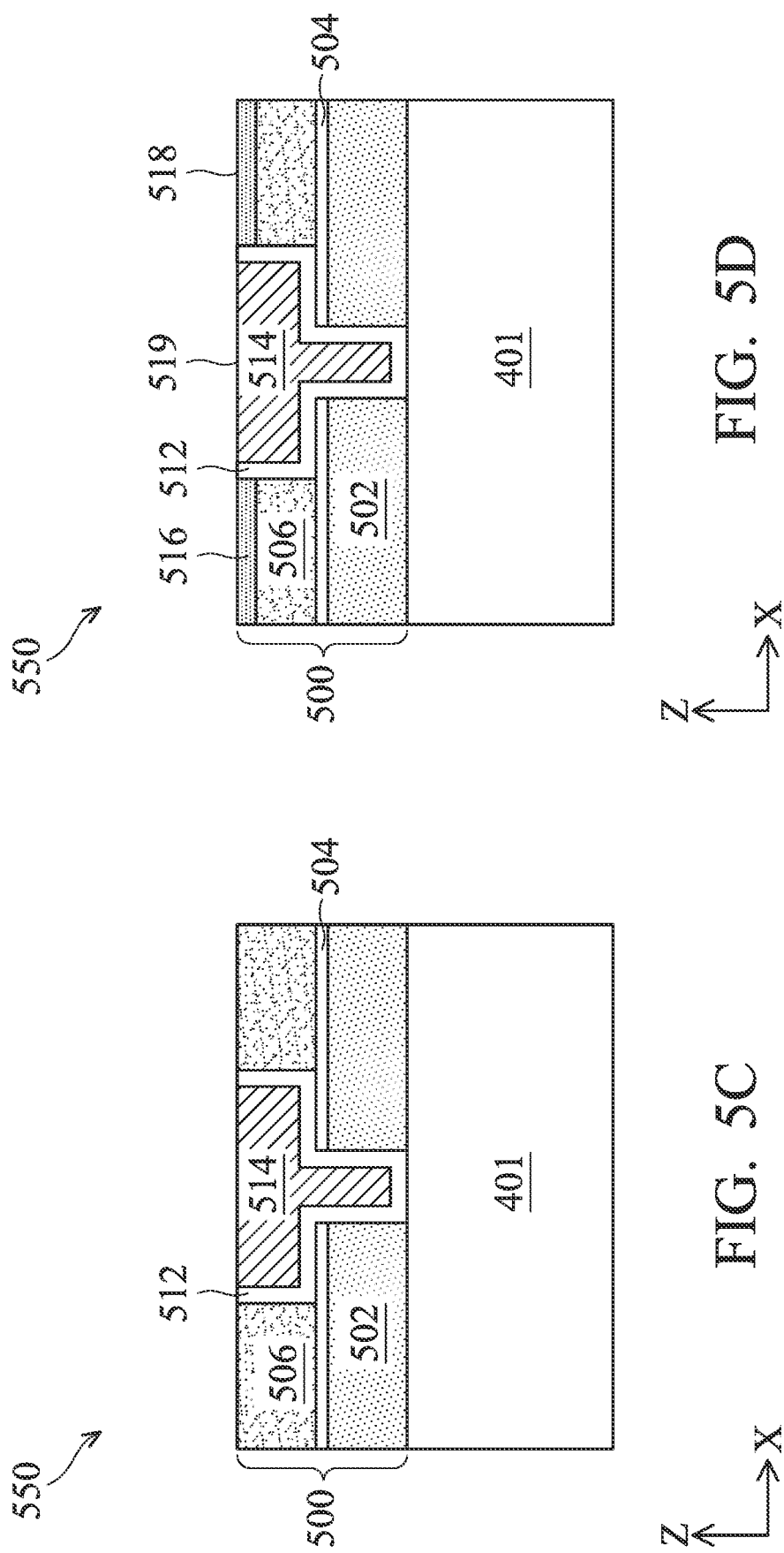

As shown in FIG. 5C, a barrier layer 512 and a conductive feature 514 are formed in each opening 508, 510. The barrier layer 512 may include the same material as the barrier layer 406, and the conductive feature 514 may include the same material as the conductive feature 408. The barrier layer 512 may be formed by the same method as the barrier layer 406, and the conductive feature 514 may be formed by the same method as the conductive feature 408. In some embodiments, the conductive feature 514 includes a via portion in the first dielectric layer 502 and a line portion in the second dielectric layer 506. As shown in FIG. 5D, the second dielectric layer 506 may be recessed and a thermal conductive layer 516 is formed on the recessed second dielectric layer 506. The thermal conductive layer 516 may include the same material as the thermal conductive layer 410 and may be formed by the same method as the thermal conductive layer 410. The recessing of the second dielectric layer 506 may be by the same method as the recessing of the dielectric layer 402 described in FIG. 3C. In some embodiments, the thermal conductive layer 516 may include a surface 518 that is substantially co-planar with a surface 519 of the conductive feature 514.

Figure 5E:
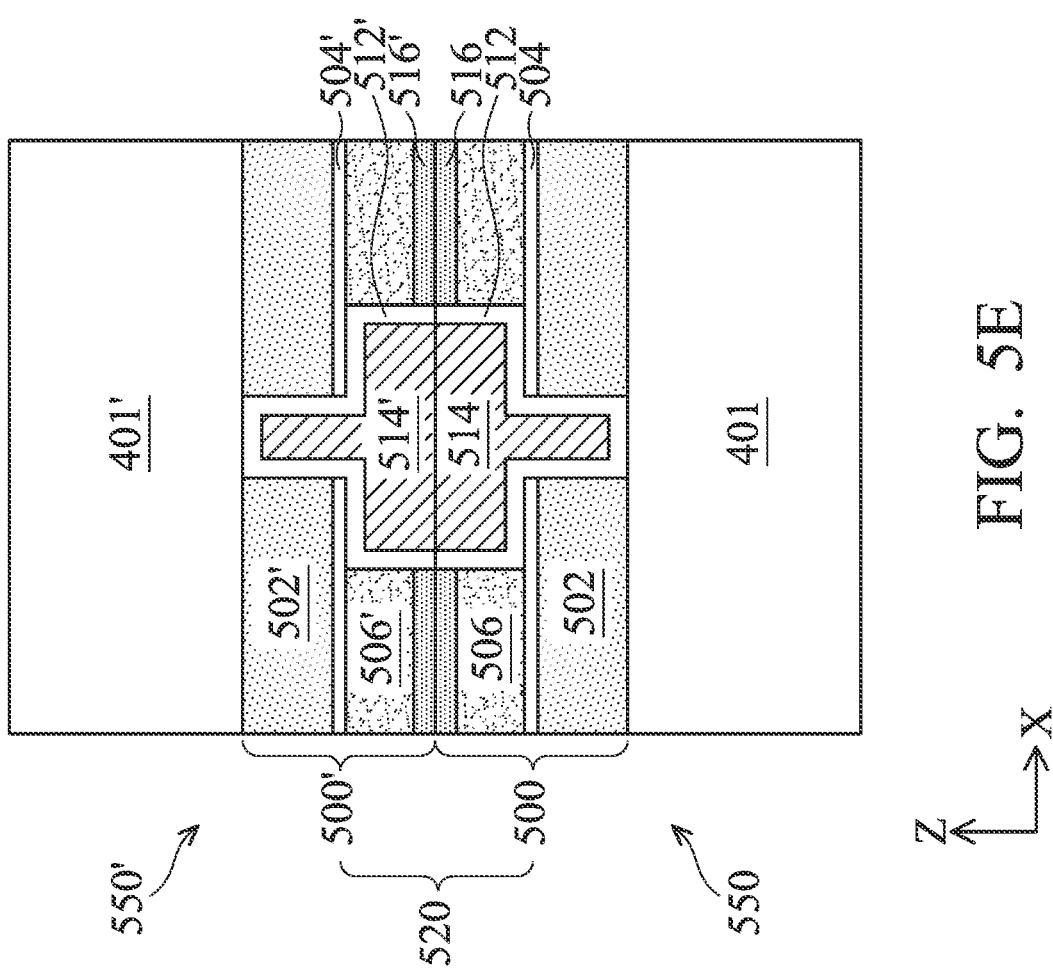

As shown in FIG. 5E, a structure 550' is bonded to the structure 550. The structure 550' may include the structure 500' disposed over the structure 401'. The structure 500' may include the same materials as the structure 500. For example, the structure 500' may include a first dielectric layer 502', an etch stop layer 504', a second dielectric layer 506', barrier layers 512', conductive features 514', and a thermal conductive layer 516'. The first and second dielectric layers 502', 506' may include the same materials as the first and second dielectric layers 502, 506, respectively, the etch stop layer 504' may include the same material as the etch stop layer 504, the barrier layers 512' may include the same material as the barrier layers 512, the conductive features 514' may include the same material as the conductive features 514, and the thermal conductive layer 516' may include the same material as the thermal conductive layer 516. The arrangement of the barrier layers 512', the conductive features 514', and the thermal conductive layer 516' may be the same as the arrangement of the barrier layers 512, the conductive features 514, and the thermal conductive layer 516. In some embodiments, the structure 500' is identical to the structure 500. The structure 401' may or may not be identical to the structure 401, as described in FIG. 3D.

As shown in FIG. 5E, the structure 550' may be flipped over and bonded to the structure 550, and the structure 500 is bonded to the structure 500'. For example, the thermal conductive layer 516 is bonded to the thermal conductive layer 516', and the conductive feature 514 is bonded to the conductive feature 514'. The bonding may be a result of exposing the structures 550', 550 to a temperature ranging from about 20 degrees Celsius to about 400 degrees Celsius. The thermal management capability for wafer stacking or die stacking may be improved due to increased thermal conductivity of the thermal conductive layers 516, 516' compared to the thermal conductivity of the dielectric layers 502, 502', 506, 506'. Furthermore, bondable thermal conductive layers 516, 516' may improve thermal dissipation and more efficient bonding process.

The bonded structures 500, 500' form an interfacial structure 520, as shown in FIG. 5E. In some embodiments, the interfacial structure 520 includes the structures 500, 500' that are substantially symmetrical with respect to an interface between the structures 500, 500'. Because the structures 500, 500' are substantially symmetrical, the conductive features 514 are aligned with corresponding conductive features 514'. In some embodiments, the structures 500, 500' are substantially asymmetrical, and the conductive features 514 may be slightly misaligned but still in contact with corresponding conductive features 514'.

Figure 6B:
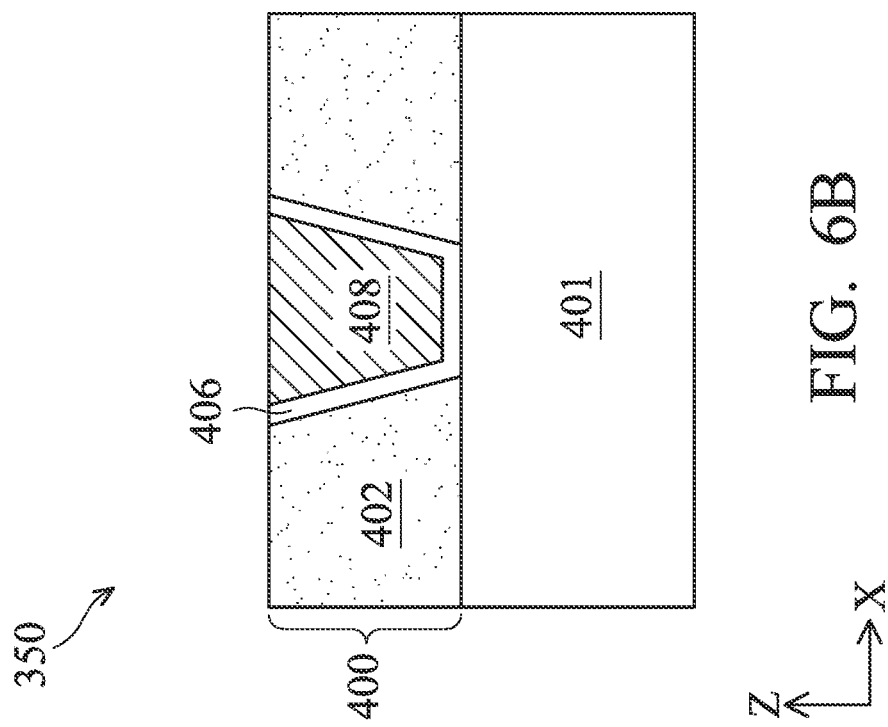
FIGS. 6A-6E are cross-sectional side views of various stages of manufacturing the semiconductor device structure, in accordance with alternative embodiments.
Figure 6A:
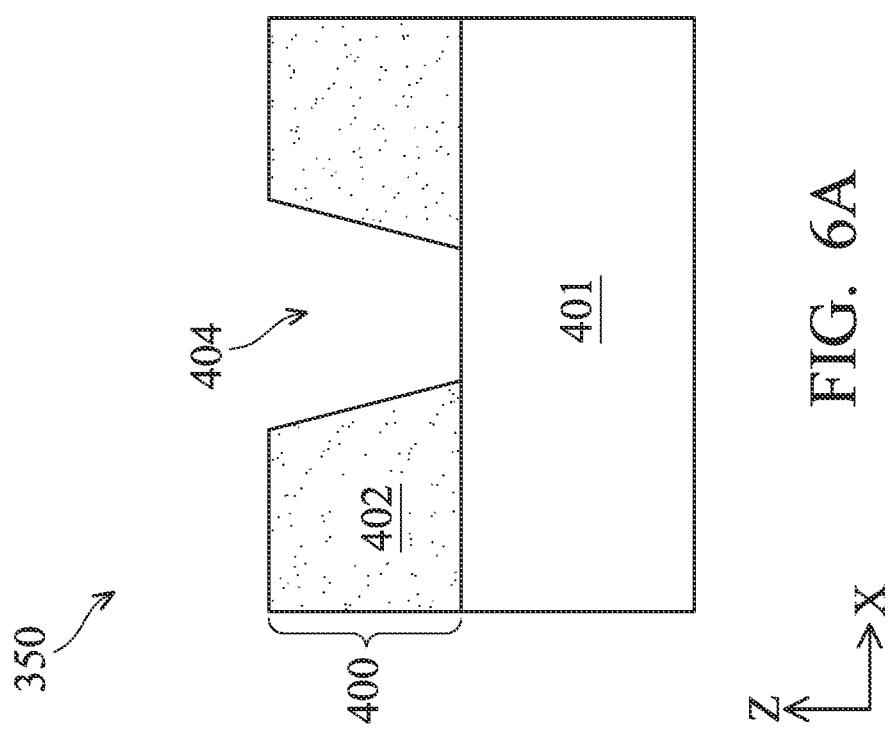
Figure 6D:
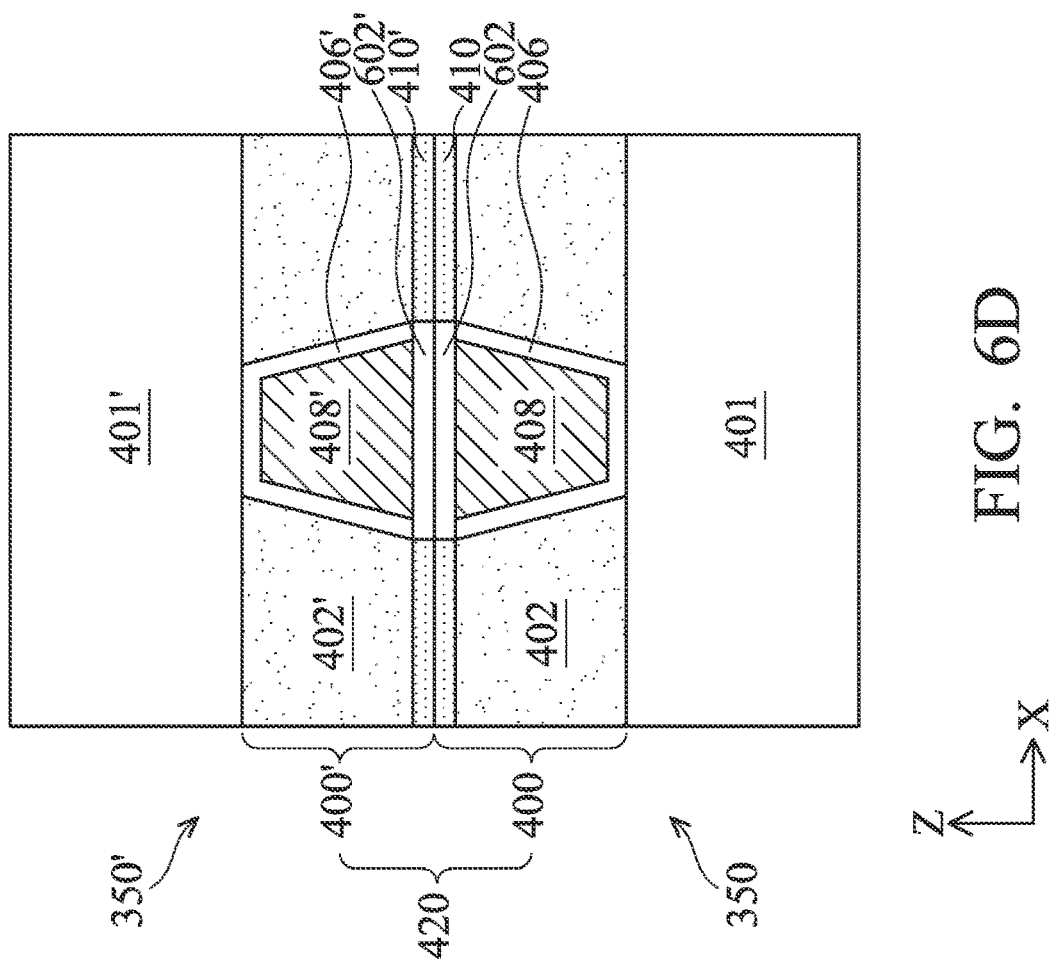
Figure 6C:
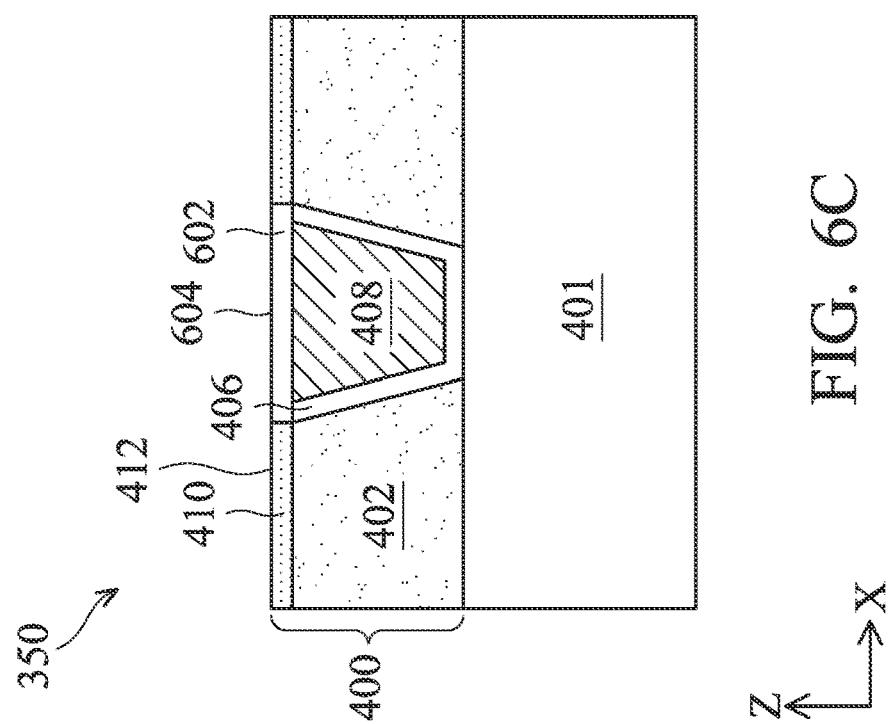

FIGS. 6A-6E illustrate an alternate method of forming the structure 400 and the structure 400'. As shown in FIGS. 6A and 6B, which is similar to FIGS. 3A and 3B, the dielectric layer 402 is formed over the structure 401, and the barrier layers 406 and the conductive features 408 are formed in the openings 404 in the dielectric layer 402. As shown in FIG. 6C, a cap layer 602 is selectively formed on each conductive feature 408. The cap layer 602 may include one or more layers of two-dimensional (2D) material, such as graphene. For example, graphene may only grow on the conductive surface of the conductive feature 408 but not the dielectric surface of the dielectric layer 402. The cap layer 602 may be also formed on the barrier layers 406. In some embodiments, the number of 2D material layers ranges from about 3 to about 17000, and the thickness of the cap layer 602 may range from about 1 nm to about 5000 nm. For example, the cap layer 602 includes 3 to 17000 layers of graphene and have a thickness ranging from about 1 nm to about 5000 nm. The thermal conductive layer 410 may be selectively formed on the dielectric surface of the dielectric layer 402 and not on the cap layer 602. For example, the cap layer 602 includes one or more layers of graphene, which prevents the thermal conductive layer 410 from grown thereon. In some embodiments, a small amount, such as a negligible amount, of the thermal conductive layer 410 may be formed on the cap layer 602. In some embodiments, the cap layer 602 may have the same thickness as the thermal conductive layer 410. In some examples, the surface 412 of the thermal conductive layer 410 may be substantially co-planar with a surface 604 of the cap layer 602.

As shown in FIG. 6D, the structure 350' is bonded to the structure 350. The structure 350' may include the structure 400' disposed over the structure 401'. The structure 400' may include the same materials as the structure 400. A cap layer 602' may include the same material and same number of layers of 2D material as the cap layer 602. In some embodiments, the structure 400' is identical to the structure 400. The structure 350' may be flipped over and bonded to the structure 350, and the structure 400 is bonded to the structure 400'. For example, the thermal conductive layer 410 is bonded to the thermal conductive layer 410', and the cap layer 602 is bonded to the cap layer 602'. In addition to the benefits of having the thermal conductive layers 410, 410', the cap layers 602, 602' can function as electromigration barrier layers and can lower electrical resistance. Thus, if the thickness of the cap layer 602 is less than about 1 nm, the cap layer 602 may not be sufficient to lower electrical resistance and/or to function as an electromigration layer. On the other hand, if the thickness of the cap layer 602 is greater than about 5000 nm, manufacturing cost is increased without significant advantage.

The bonded structures 400, 400' form an interfacial structure 420, as shown in FIG. 6D. In some embodiments, the interfacial structure 420 includes the structures 400, 400' that are substantially symmetrical with respect to an interface between the structures 400, 400'. Because the structures 400, 400' are substantially symmetrical, the cap layer 602 is aligned with corresponding cap layer 602'.

Figure 6E:
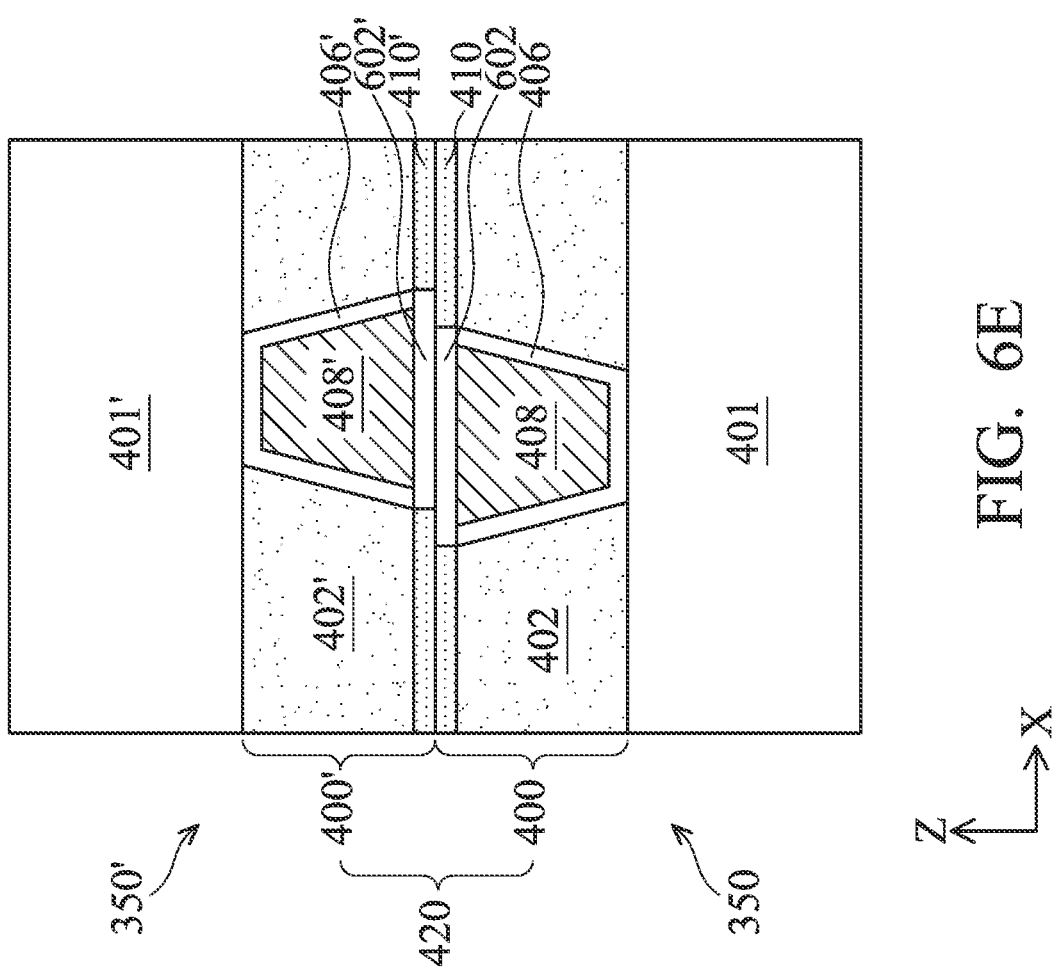

As shown in FIG. 6E, in some embodiments, the structures 400, 400' are substantially asymmetrical, and the cap layer 602 may be slightly misaligned but still in contact with corresponding cap layer 602'. For example, the thermal conductive layer 410 may be in contact with a portion of the cap layer 602', and the thermal conductive layer 410' may be in contact with a portion of the cap layer 602. In some embodiments, the thermal conductive layer 410' is disposed over a portion of the cap layer 602, and the cap layer 602' is disposed over a portion of the thermal conductive layer 410.

Figure 7B:
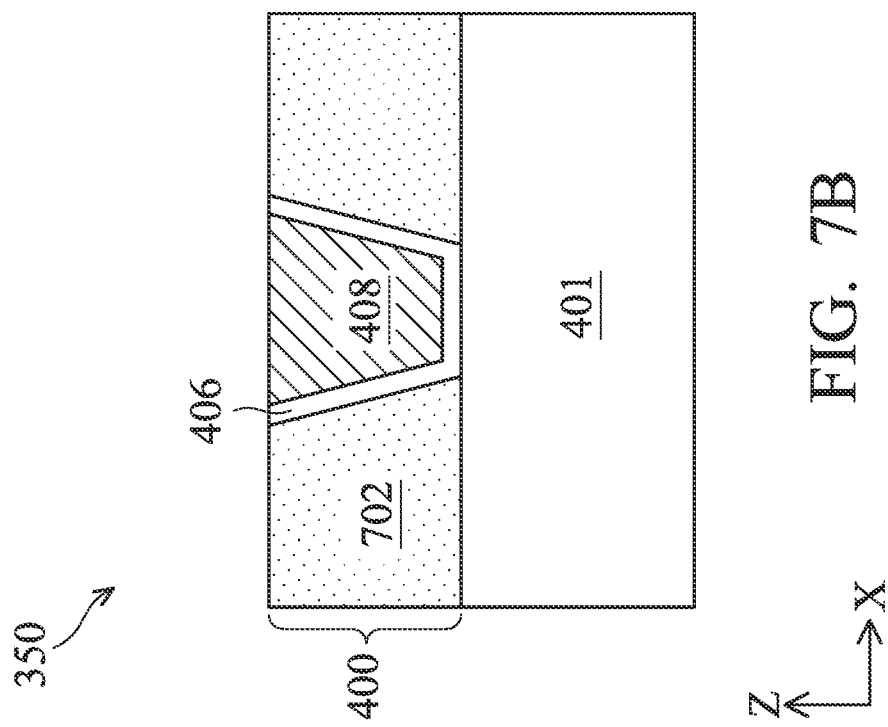
FIGS. 7A-7C are cross-sectional side views of various stages of manufacturing the semiconductor device structure, in accordance with alternative embodiments.
Figure 7A:
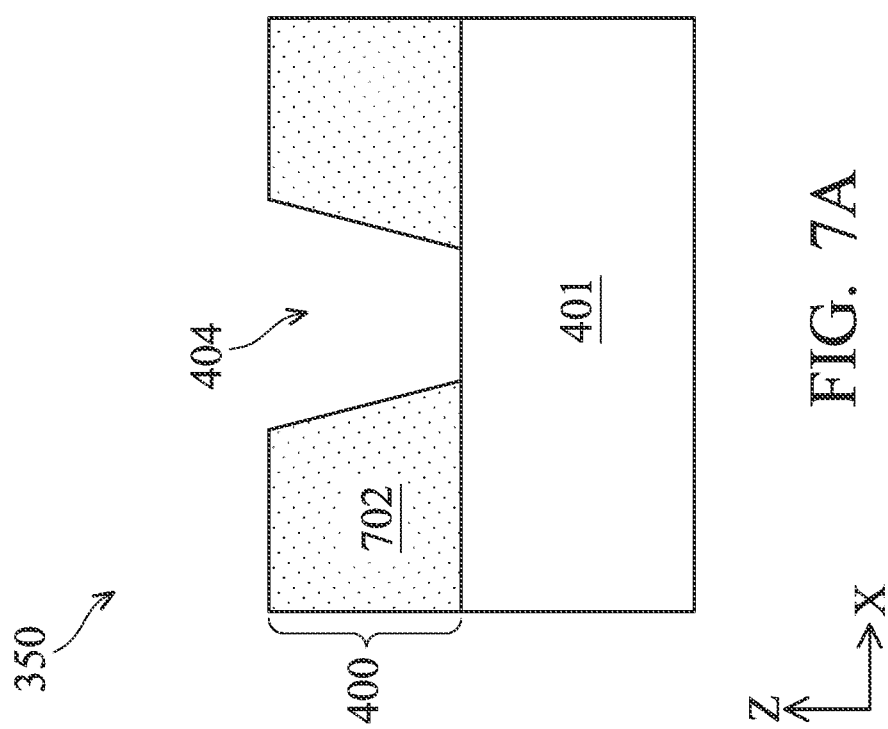
Figure 7C:
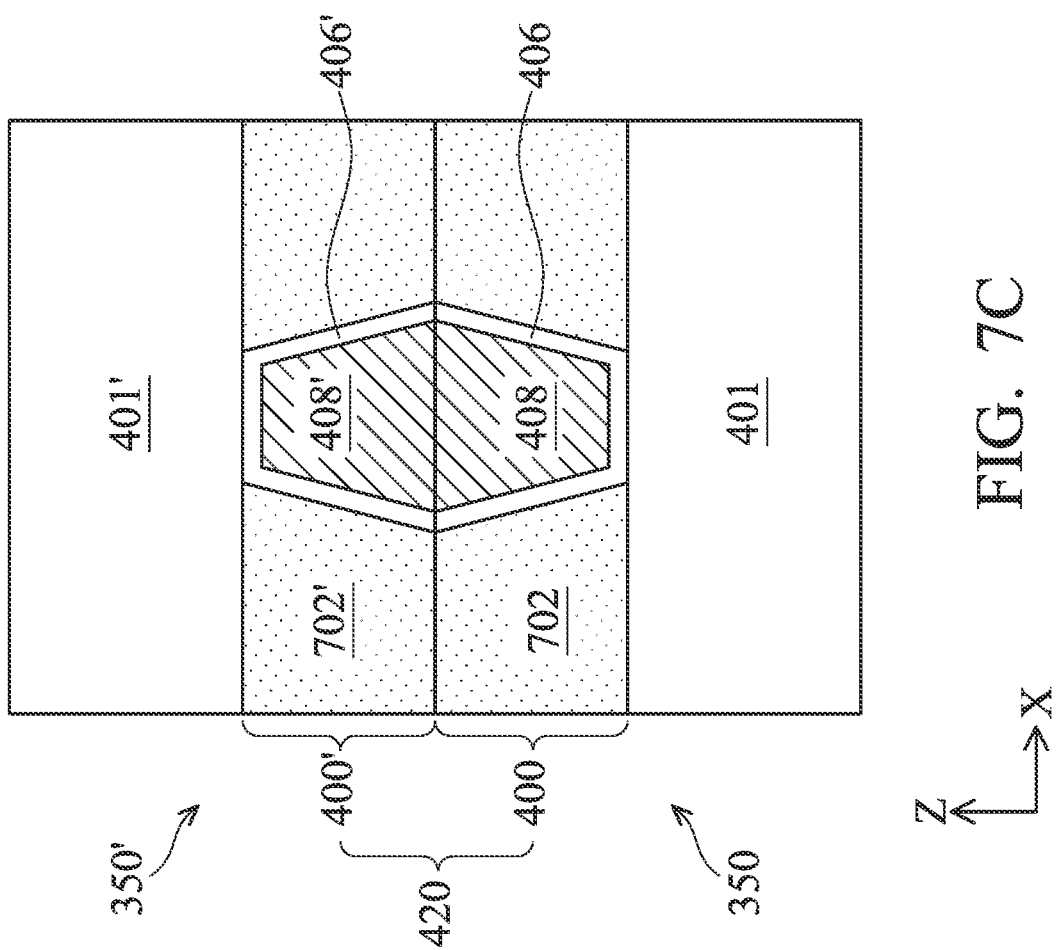

FIGS. 7A-7C illustrate an alternate method of forming the structure 400 and the structure 400'. As shown in FIG. 7A, the structure 400 is formed on a structure 401. The structure 400 may be formed by first forming a thermal conductive layer 702 over the structure 401 and them forming the openings 404 (only one is shown) in the thermal conductive layer 702. One or more etch stop layers (not shown) may be formed between the thermal conductive layer 702 and the structure 401. The openings 404 may expose portions of the structure 401. In some embodiments, the top-most conductive features 304 (FIG. 2) in the interconnect structure 300 (FIG. 2) are exposed by the openings 404. In some embodiments, the conductive contacts 126 (FIG. 1B) and the gate electrode layer 136 (FIG. 1B) may be exposed by the openings 404. The thermal conductive layer 702 may include the same material as the thermal conductive layer 410 (FIG. 3C) and may be formed by CVD, ALD, spin coating, or other suitable process. The thermal conductive layer 702 may be deposited at a temperature less than about 425 degrees Celsius. In some embodiments, an anneal or UV cure process may be performed after depositing the thermal conductive layer 702. The openings 404 may be formed by any suitable process, such as dry etch, wet etch, or a combination thereof. The barrier layer 406 and the conductive feature 408 are formed in each opening 404, as shown in FIG. 7B.

The thermal conductive layer 702, the barrier layers 406, and the conductive features 408 may be formed by the process flow described in FIGS. 4A and 4B. For example, in some embodiments, the conductive features 408 are formed first, followed by forming the barrier layers 406 and the thermal conductive layer 702. In some embodiments, the thermal conductive layer 702, the barrier layers 406, and the conductive features 408 may be formed by a dual-damascene process as described in FIGS. 5A-5D. For example, the first and second dielectric layers 502, 506 described in FIGS. 5A-5D may be replaced with the first and second thermal conductive layers.

As shown in FIG. 7C, the structure 350' is bonded to the structure 350. The structure 350' may include the structure 400' disposed over the structure 401'. The structure 400' may include the same materials as the structure 400. For example, the structure 400' includes a thermal conductive layer 702', and barrier layers 406' and conductive features 408' are formed in the thermal conductive layer 702'. In some embodiments, the structure 400' is identical to the structure 400. The structure 350' may be flipped over and bonded to the structure 350, and the structure 400 is bonded to the structure 400'. For example, the thermal conductive layer 702 is bonded to the thermal conductive layer 702', and the conductive features 408 are bonded to the conductive features 408'. The thermal management capability for wafer stacking or die stacking may be improved due to increased thermal conductivity of the thermal conductive layers 702, 702'. Furthermore, bondable thermal conductive layers 702, 702' may improve thermal dissipation and more efficient bonding process.

The bonded structures 400, 400' form the interfacial structure 420, as shown in FIG. 7C. In some embodiments, the interfacial structure 420 includes the structures 400, 400' that are substantially symmetrical with respect to an interface between the structures 400, 400'. Because the structures 400, 400' are substantially symmetrical, the conductive features 408 are aligned with corresponding conductive features 408'. In some embodiments, the structures 400, 400' are substantially asymmetrical, and the conductive features 408 may be slightly misaligned but still in contact with corresponding conductive features 408'.

Figure 8B:
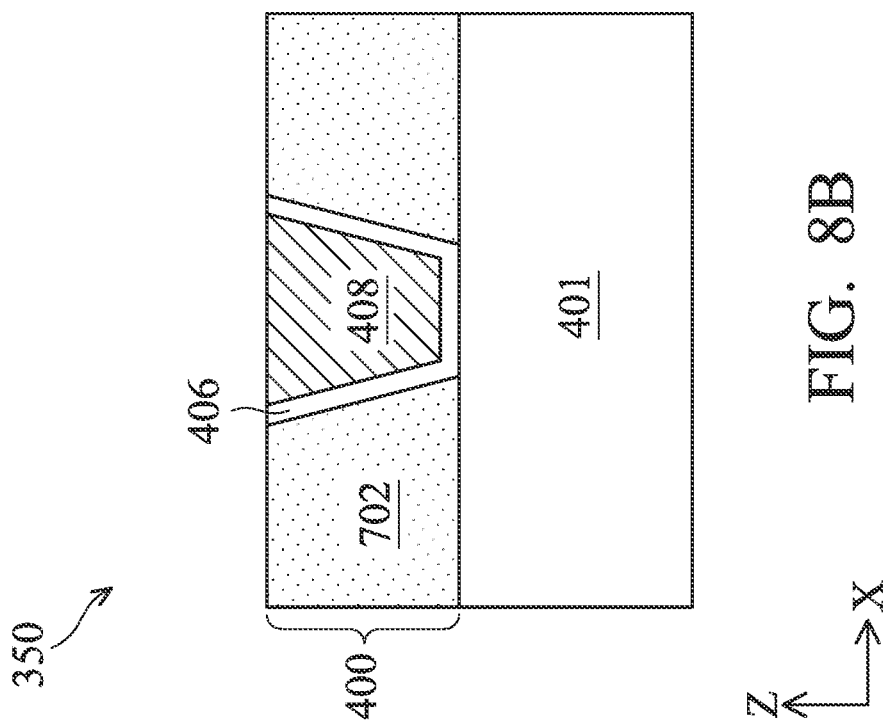
FIGS. 8A-8D are cross-sectional side views of various stages of manufacturing the semiconductor device structure, in accordance with alternative embodiments.
Figure 8A:
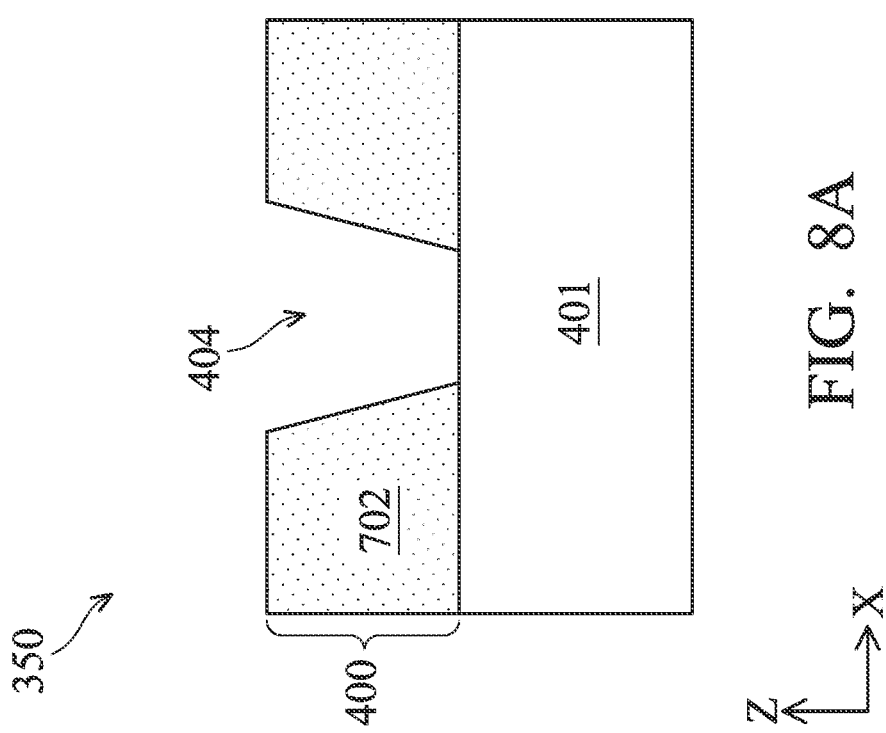
Figure 8D:
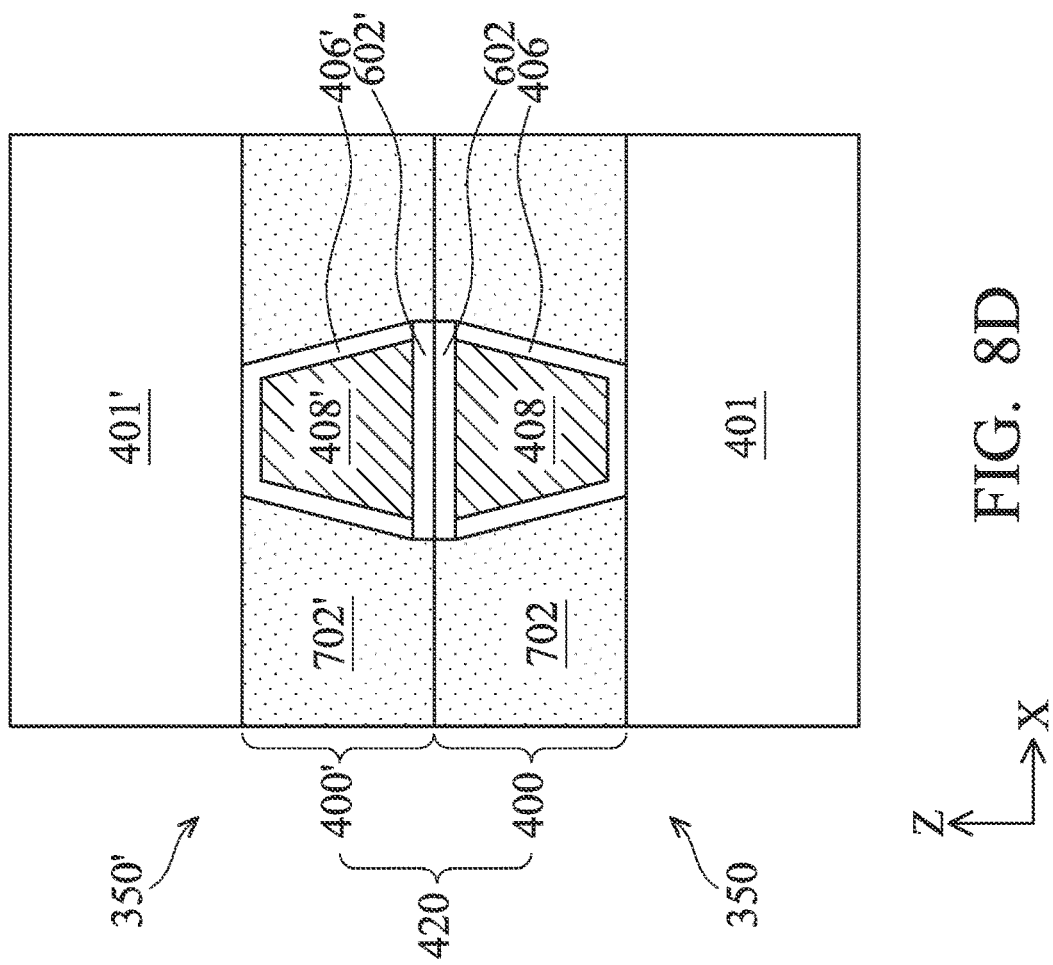
Figure 8C:
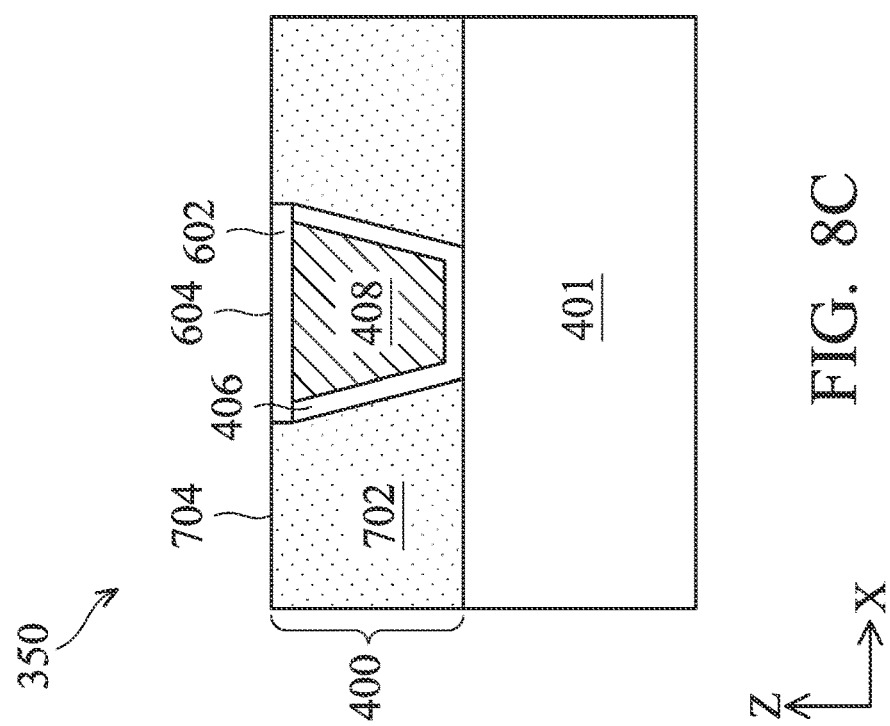

FIGS. 8A-8D illustrate an alternate method of forming the structure 400 and the structure 400'. As shown in FIGS. 8A and 8B, which is similar to FIGS. 7A and 7B, the thermal conductive layer 702 is formed over the structure 401, and the barrier layers 406 and the conductive features 408 are formed in the openings 404 in the thermal conductive layer 702. As shown in FIG. 8C, the cap layer 602 is selectively formed on each conductive feature 408. The cap layer 602 may be also formed on the barrier layers 406. In some embodiments, the conductive features 408 and the barrier layers 406 may be recessed before selectively forming the cap layer 602 on each conductive feature 408.

As shown in FIG. 8D, the structure 350' is bonded to the structure 350. The structure 350' may include the structure 400' disposed over the structure 401'. The structure 400' may include the same materials as the structure 400. For example, the structure 400' includes the thermal conductive layer 702', the cap layer 602', the barrier layers 406', and conductive features 408'. The cap layer 602' may include the same material and same number of layers of 2D material as the cap layer 602. In some embodiments, the structure 400' is identical to the structure 400. The structure 350' may be flipped over and bonded to the structure 350, and the structure 400 is bonded to the structure 400'. For example, the thermal conductive layer 702 is bonded to the thermal conductive layer 702', and the cap layer 602 is bonded to the cap layer 602'.

The bonded structures 400, 400' form an interfacial structure 420, as shown in FIG. 8D. In some embodiments, the interfacial structure 420 includes the structures 400, 400' that are substantially symmetrical with respect to an interface between the structures 400, 400'. Because the structures 400, 400' are substantially symmetrical, the cap layer 602 is aligned with corresponding cap layer 602'. In some embodiments, the structures 400, 400' are substantially asymmetrical, and the cap layer 602 may be slightly misaligned but still in contact with corresponding cap layer 602'.

The present disclosure in various embodiments provides a thermal conductive layer in a 3DIC and the method of making the 3DIC. The thermal conductive layers may be disposed in the interfacial structure as a result of bonding two structures. In some embodiments, the thermal conductive layer may be formed over a dielectric material having conductive features formed therein. In some embodiments, the conductive features are formed in the thermal conductive layer. The present disclosure further provides a cap layer formed on the conductive features. Some embodiments may achieve advantages. For example, the thermal management capability for wafer stacking or die stacking may be improved due to increased thermal conductivity of the thermal conductive layers, which also may improve thermal dissipation and more efficient bonding process. Furthermore, the cap layer can function as electromigration barrier layers and can lower electrical resistance.

An embodiment is an interfacial structure. The structure includes a first structure having a first dielectric layer, a first conductive feature disposed in the first dielectric layer, and a first thermal conductive layer disposed on the first dielectric layer. The first conductive feature includes a first sidewall. The structure further includes a second structure disposed on the first structure. The second structure includes a second thermal conductive layer disposed on the first thermal conductive layer, a second dielectric layer disposed on the second thermal conductive layer, and a second conductive feature disposed in the second dielectric layer. The second conductive feature has a second sidewall disposed over the first sidewall, and the first sidewall and the second sidewall taper in opposite directions.

Another embodiment is an interfacial structure. The structure includes a first structure having a first thermal conductive layer and a first conductive feature disposed in the first thermal conductive layer. The first thermal conductive layer includes SiC, SiN, SiCN, AlN, $AlO_x$, BN, diamond, diamond-like carbon, graphene oxide, or graphite. The structure further includes a second structure disposed on the first structure. The first structure and the second structure are substantially symmetrical with respect to an interface between the first structure and the second structure. The second structure includes a second thermal conductive layer disposed on the first thermal conductive layer and a second conductive feature disposed in the second thermal conductive layer.

A further embodiment is a 3DIC. The 3DIC includes a first device layer and a first structure disposed over the first device layer. The first structure includes a first dielectric layer, a first conductive feature disposed in the first dielectric layer, and a first thermal conductive layer disposed on the first dielectric layer. The first thermal conductive layer has a higher thermal conductivity than the first dielectric layer. The 3DIC further includes a second structure disposed on the first structure. The second structure includes a second thermal conductive layer disposed over a portion of the first thermal conductive layer and a portion of the first conductive layer, a second dielectric layer disposed on the second thermal conductive layer, and a second conductive feature disposed in the second dielectric layer. The second conductive feature is disposed over a portion of the first conductive feature and a portion of the first thermal conductive layer. The 3DIC further includes a second device layer disposed over the second structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming an interfacial structure, comprising:
   forming a first structure, comprising:
   forming an opening in a dielectric layer;
   forming a conductive feature in the opening;
   selectively forming a first cap layer on the conductive feature by a first process; and then
   selectively forming a first thermal conductive layer on the dielectric layer by a second process different from the first process, wherein a surface of the first thermal conductive layer and a surface of the first cap layer are substantially co-planar;
   forming a second structure; and
   bonding the second structure to the first structure.

2. The method of claim 1, wherein the second structure comprises a second cap layer and a second thermal conductive layer.

3. The method of claim 2, wherein the first thermal conductive layer is bonded to the second thermal conductive layer, and the first cap layer is bonded to the second cap layer.

4. The method of claim 1, wherein the first cap layer comprises one or more layers of a two-dimensional material.

5. The method of claim 4, wherein the two-dimensional material comprises graphene.

6. The method of claim 1, wherein the first thermal conductive layer comprises boron nitride, diamond-like carbon, graphene oxide, or graphite.

7. A method for forming an interfacial structure, comprising:
   forming a first structure, comprising:
   forming an opening in a dielectric layer;
   depositing a barrier layer in the opening;
   depositing a conductive feature on the barrier layer in the opening;
   selectively forming a first cap layer on the conductive feature by a first process; and then
   selectively forming a first thermal conductive layer on the dielectric layer by a second process different from the first process, wherein a surface of the first thermal conductive layer and a surface of the first cap layer are substantially co-planar;
   forming a second structure; and
   bonding the second structure to the first structure.

8. The method of claim 7, wherein the barrier layer is a conformal layer deposited by a conformal process.

9. The method of claim 7, wherein the conductive feature comprises a metal.

10. The method of claim 9, wherein the conductive feature is deposited by electro-chemical plating or physical vapor deposition.

11. The method of claim 7, wherein the first cap layer comprises one or more layers of a two-dimensional material.

12. The method of claim 11, wherein the two-dimensional material is graphene.

13. The method of claim 12, wherein the graphene is selectively grown on the conductive feature.

14. The method of claim 11, wherein the one or more layers of the two-dimensional material comprises three to 17000 layers of the two-dimensional material.

15. The method of claim 7, wherein the second structure comprises a second cap layer and a second thermal conductive layer.

16. The method of claim 15, wherein the first thermal conductive layer is bonded to the second thermal conductive layer, and the first cap layer is bonded to the second cap layer.

17. A method for forming an interfacial structure, comprising:
   forming a first structure, comprising:
   forming an opening in a dielectric layer;
   depositing a conductive feature in the opening;
   selectively forming a first cap layer on the conductive feature by a first process; and then
   selectively forming a first thermal conductive layer on the dielectric layer by a second process different from the first process, wherein the first thermal conductive layer and the dielectric layer comprise different materials and a surface of the first thermal conductive layer and a surface of the first cap layer are substantially co-planar;
   forming a second structure; and
   bonding the second structure to the first structure.

18. The method of claim 17, wherein the second structure comprises a second cap layer and a second thermal conductive layer.

19. The method of claim 18, wherein the second cap layer is in contact with the first cap layer and the first thermal conductive layer.

20. The method of claim 19, wherein the second thermal conductive layer is in contact with the first cap layer and the first thermal conductive layer.

* * * * *